United States Patent
Lee et al.

(10) Patent No.: US 12,262,470 B2
(45) Date of Patent: Mar. 25, 2025

(54) PRINTED CIRCUIT BOARD

(71) Applicant: SAMSUNG ELECTRO-MECHANICS CO., LTD., Suwon-si (KR)

(72) Inventors: Jin Uk Lee, Suwon-si (KR); Chi Won Hwang, Suwon-si (KR); Eun Sun Kim, Suwon-si (KR); Yong Wan Ji, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 508 days.

(21) Appl. No.: 17/578,864

(22) Filed: Jan. 19, 2022

(65) Prior Publication Data

US 2023/0066381 A1 Mar. 2, 2023

(30) Foreign Application Priority Data

Aug. 30, 2021 (KR) .................. 10-2021-0114389

(51) Int. Cl.
*H05K 1/11* (2006.01)
*H05K 1/02* (2006.01)

(52) U.S. Cl.
CPC ........... *H05K 1/113* (2013.01); *H05K 1/0298* (2013.01); *H05K 1/115* (2013.01); *H05K 2201/095* (2013.01); *H05K 2201/096* (2013.01)

(58) Field of Classification Search
CPC .............. H05K 1/113; H05K 1/0298; H05K 2201/096; H05K 2201/09227; H05K 2201/09236; H05K 2201/095; H05K 2201/09672; H05K 2201/09709; H05K 2201/10734; H05K 3/4623; H05K 1/111; H05K 1/115; H05K 1/142; H05K 1/183–186; H05K 3/4694; H05K 1/0313; H05K 1/03; H05K 1/185;

(Continued)

(56) References Cited

U.S. PATENT DOCUMENTS

| 9,374,896 | B2 * | 6/2016 | Chen ................. H05K 3/4038 |
| 2012/0234589 | A1 * | 9/2012 | Furuichi ......... H01L 23/49822 29/837 |

(Continued)

FOREIGN PATENT DOCUMENTS

| KR | 10-2016-0058666 A | 5/2016 |
| KR | 10-2017-0113819 A | 10/2017 |
| KR | 10-2020-0069573 A | 6/2020 |

*Primary Examiner* — Steven T Sawyer
(74) *Attorney, Agent, or Firm* — MORGAN, LEWIS & BOCKIUS LLP

(57) ABSTRACT

A printed circuit board includes a first board including a plurality of first insulating layers and a plurality of first wiring layers disposed between the plurality of first insulating layers, respectively; and a second board disposed on one surface of the first board and including a plurality of second insulating layers and a plurality of second wiring layers disposed on or between the plurality of second insulating layers, respectively. At least one of the plurality of first insulating layers has a thickness less than a thickness of at least one of the plurality of second insulating layers. The first board further includes a through-via penetrating each of the plurality of first insulating layers and connected to one of the plurality of second wiring layers.

23 Claims, 24 Drawing Sheets

(58) Field of Classification Search
CPC ........ H05K 2201/0154; H01L 23/5383; H01L 23/49822; H01L 23/5385; H01L 23/5381; H01L 24/24; H01L 24/97; H01L 21/4857; H01L 21/486; H01L 23/5386; H01L 24/19; H01L 24/82; H01L 23/49894; H01L 24/16; H01L 2224/16235; H01L 2224/13147; H01L 24/14; H01L 2224/13111; H01L 2224/16225; H01L 2924/15192

See application file for complete search history.

(56) References Cited

U.S. PATENT DOCUMENTS

| | | | |
|---|---|---|---|
| 2014/0070380 A1* | 3/2014 | Chiu | H01L 23/5381 438/107 |
| 2014/0347837 A1* | 11/2014 | Kariya | H05K 3/4694 156/247 |
| 2015/0116965 A1* | 4/2015 | Kim | H01L 23/5385 361/767 |
| 2016/0105960 A1* | 4/2016 | Sakamoto | H01L 23/5383 174/262 |
| 2016/0141234 A1* | 5/2016 | We | H01L 25/0655 361/767 |
| 2016/0143137 A1 | 5/2016 | Baek et al. | |
| 2019/0363049 A1* | 11/2019 | Mekonnen | H01L 21/486 |
| 2020/0083179 A1* | 3/2020 | Lee | H01L 23/5384 |
| 2020/0144186 A1* | 5/2020 | Thomas | H01L 23/5381 |
| 2021/0183753 A1* | 6/2021 | Sakuma | H01L 24/73 |

* cited by examiner

PRINTED CIRCUIT BOARD

CROSS-REFERENCE TO RELATED APPLICATION(S)

This application claims benefit of priority to Korean Patent Application No. 10-2021-0114389 filed on Aug. 30, 2021 in the Korean Intellectual Property Office, the disclosure of which is incorporated herein by reference in its entirety.

TECHNICAL FIELD

The present disclosure relates to a printed circuit board, and more particularly, to a printed circuit board having a fine circuit.

BACKGROUND

In accordance with the implementation of high performance in printed circuit board (PCB) products and package assembly, there has been continuous demand for reducing a thickness of the board and a size of circuit wirings. Particularly, a multi-chip packaged board has been necessary, and a circuit line width of PCB products and packages has also been reduced according to the improvement of performance of electronic components such as an application specific integrated circuit (ASIC) and a high-bandwidth memory (HBM). Accordingly, a board structure having a fine circuit which may directly connect electronic components has been continuously suggested.

In multi-chip packaging, a connection structure wiring for connecting chips may be necessary. When the connection structure is separately manufactured and inserted as in an embedded multi-die interconnect bridge (EMIB), there may be positional tolerance of the connection structure. When the tolerance formed when an electronic component is mounted is added to the tolerance formed when the connection structure is embedded, a package defect rate may increase. However, when the connection structure is disposed directly on a redistribution layer, the above issue may be addressed.

A circuit of the connection structure may require high-density wiring. In a case in which the circuit of the connection structure is not able to be manufactured as a single layer due to a limitation of resolution, a multilayer connection structure may be necessary. In this case, a metal layer may be penetrated during the process of forming a via, such that it may be difficult to reduce a thickness of the metal layer. When the thickness of a metal layer is reduced, the process capability for a fine circuit may be degraded, and a thickness of a connection structure may increase.

SUMMARY

An aspect of the present disclosure is to provide a printed circuit board in which a fine circuit is implemented.

Another aspect of the present disclosure is to provide a printed circuit board in which a connection structure is not embedded and a fine circuit is disposed on a redistribution layer.

Another aspect of the present disclosure is to provide a printed circuit board having high surface flatness such that electronic components may be easily mounted thereon.

Another aspect of the present disclosure is to provide a printed circuit board having an improved yield by initially manufacturing a board on which a fine circuit is implemented.

According to an aspect of the present disclosure, a printed circuit board includes a first board including a plurality of first insulating layers and a plurality of first wiring layers disposed between the plurality of first insulating layers, respectively; and a second board disposed on one surface of the first board and including a plurality of second insulating layers and a plurality of second wiring layers disposed on or between the plurality of second insulating layers, respectively. At least one of the plurality of first insulating layers has a thickness less than a thickness of at least one of the plurality of second insulating layers. The first board further includes a through-via penetrating each of the plurality of first insulating layers and connected to one of the plurality of second wiring layers.

According to another aspect of the present disclosure, a printed circuit board includes a first board including a plurality of first insulating layers, a plurality of first wiring layers, and a plurality of first via layers; and a second board covering the first board and including a plurality of second insulating layers, a plurality of second wiring layers, and a plurality of second via layers. The first board further includes a through-via penetrating each of the plurality of first insulating layers and connected to one of the plurality of second wiring layers. The plurality of second insulating layers include a 2-1 insulating layer covering one surface and a side surface of the first board.

According to another aspect of the present disclosure, a printed circuit board includes a first board including a plurality of first insulating layers and a plurality of first wiring layers disposed between the plurality of first insulating layers, respectively; and a second board disposed directly on the first board and including a plurality of second insulating layers and a plurality of second wiring layers disposed on or between the plurality of second insulating layers, respectively. At least one of the plurality of first insulating layers has a thickness less than a thickness of at least one of the plurality of second insulating layers. Vias connected to the plurality of first wiring layers and the plurality of second wiring layers have a tapered shape in which a cross-sectional area thereof decreases from the second board to the first board.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the attached drawings.

Figure 1:
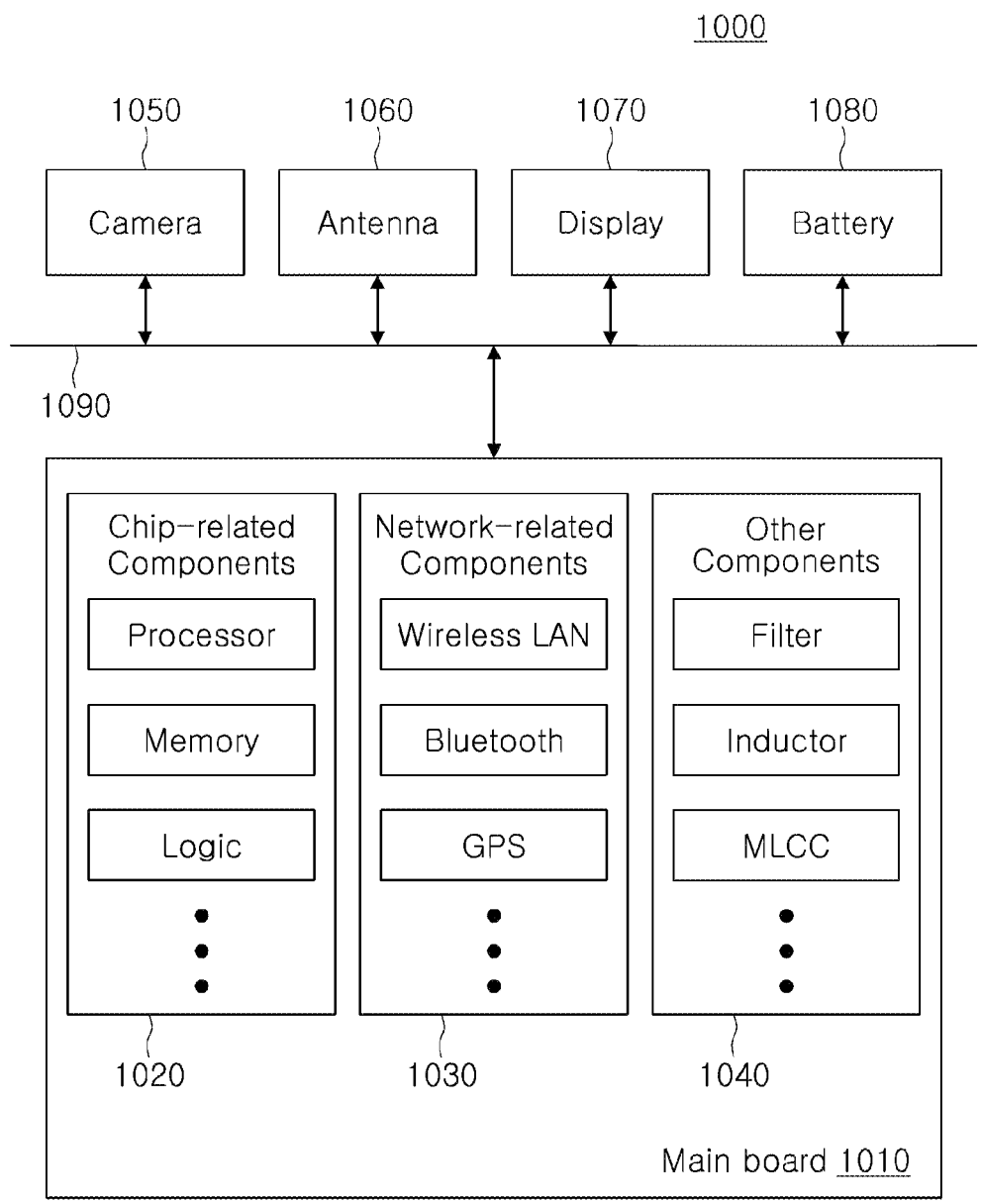
FIG. 1 is a block diagram illustrating an example of an electronic device system.

FIG. 1 is a block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal wirings 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. Also, the chip related components 1020 may be combined with each other. The chip related components 1020 may have a package form including the above-described chip.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include a variety of other wireless or wired standards or protocols. Also, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. Also, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, and a battery 1080. However, an example embodiment thereof is not limited thereto, and these other components may include an audio codec, a video codec, a power amplifier, a compass, an accelerometer, a gyroscope, a speaker, a mass storage unit (for example, a hard disk drive), a compact disk (CD) drive), a digital versatile disk (DVD) drive, or the like. Also to the above examples, other components used for various purposes depending on a type of electronic device 1000, or the like, may be included.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
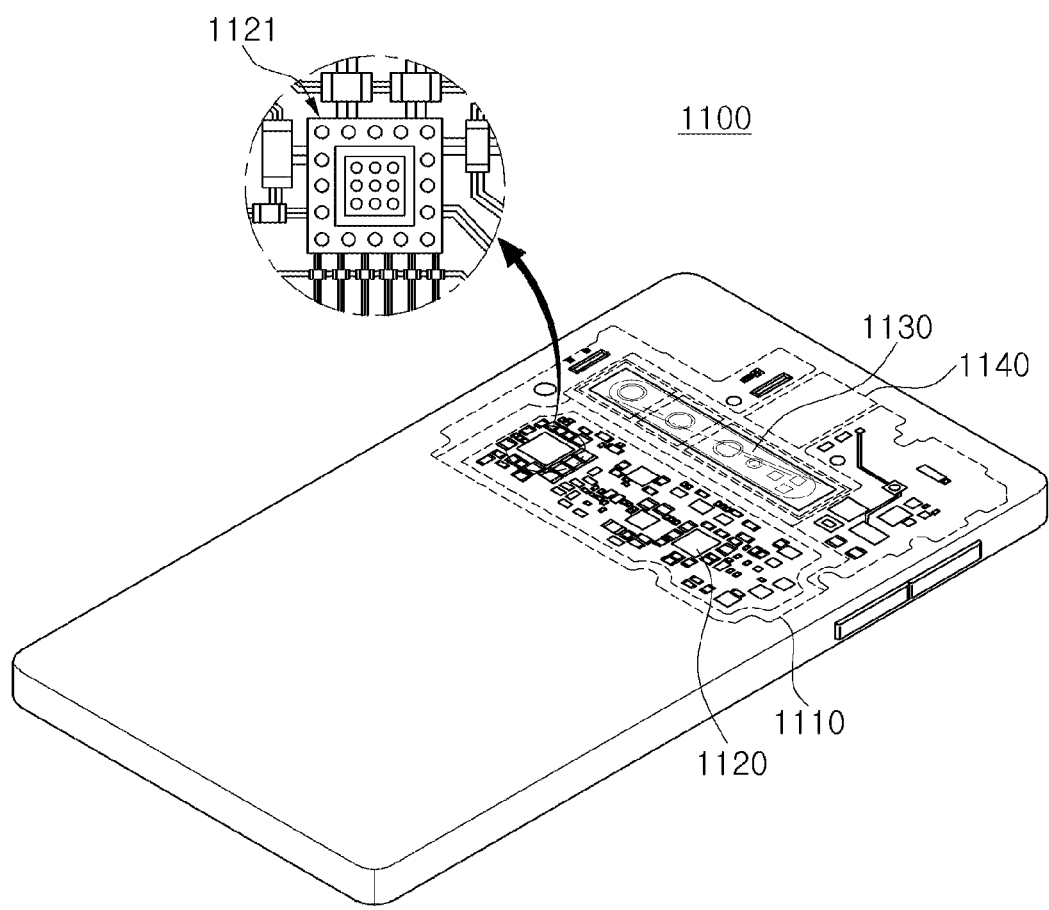
FIG. 2 is a perspective diagram illustrating an example of an electronic device.

FIG. 2 is a perspective diagram illustrating an example of an electronic device.

Referring to FIG. 2, the electronic device may be implemented by a smartphone 1100. A motherboard 1110 may be accommodated in a smartphone 1100, and various electronic components 1120 may be physically or electrically connected to the motherboard 1110. The camera module 1130 and/or the speaker 1140 may be accommodated therein. A portion of the components 1120 may be the chip related components, such as a printed circuit board 1121, for example, but an example embodiment thereof is not limited thereto. In the printed circuit board 1121, a plurality of electronic components may be disposed on a multilayer printed circuit board in the form of surface mounting, but an example embodiment thereof is not limited thereto. The electronic device is not necessarily limited to the smartphone 1100, and may be other electronic devices as described above.

Figure 3:
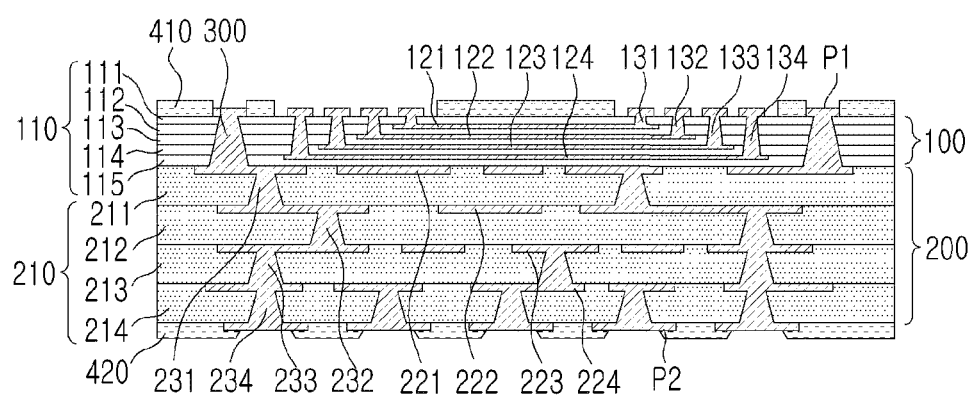
FIG. 3 is a cross-sectional diagram illustrating an example of a printed circuit board.

FIG. 3 is a cross-sectional diagram illustrating an example of a printed circuit board.

Referring to the drawing, a printed circuit board 700A1 according to an example embodiment may include a first board 100 including a first insulating body 110 including a plurality of first insulating layers 111, 112, 113, 114, and 115, a plurality of first wiring layers 121, 122, 123, and 124 disposed in the first insulating body 110, and a plurality of first via layers 131, 132, 133, and 134 disposed in the first insulating body 110, a second board 200 disposed on one surface of the first board 100 and including a second insulating body 210 including a plurality of second insulating layers 211, 212, 213, and 214, a plurality of second wiring layers 221, 222, 223, and 224 disposed on or in the second insulating body 210, and a plurality of second via layers 231, 232, 233, and 234 disposed in the second insulating body 210, a through-via 300 penetrating the first board 100, a first connection pad layer P1 disposed on the other surface of the first board 100, and a second connection pad layer P2 disposed on the other surface of the second board 200. The first insulating layer 111, 112, 113, 114, and 115 of each of the first insulating body 110 and the second insulating layer 211, 212, 213, and 214 of each of the second insulating body 210 may include an insulating resin. Also, the plurality of first wiring layers 121, 122, 123, and 124 in the first board 100 may have a circuit having density higher than that of the plurality of second wiring layers 221, 222, 223 and 224 in the second board 200. As described above, the printed circuit board 700A1 according to an example embodiment may have a structure in which the first board 100 having a circuit having high density is in contact with the second board 200 without forming a cavity.

The first insulating body 110 of the first board 100 may include a 1-1 insulating layer 111, a 1-2 insulating layer 112, a 1-3 insulating layer 113, a 1-4 insulating layer 114 and a 1-5 insulating layer 115. As illustrated in FIG. 3, the plurality of first insulating layers 111, 112, 113, 114, and 115 of the first board 100 may have substantially the same width as that of the second board 200. Here, the configuration of being substantially the same may include the configuration in which the elements are numerically and physically exactly the same, including errors in process. That is, when comparing a cross-sectional area in a direction perpendicular to the lamination direction of the printed circuit board 700A1, the first insulating body 110 of the first board 100 may be disposed on the front surface of the second board 200. As the first board 100 having a high-density circuit is disposed on one surface of the second board 200 rather than being embedded in the second board 200, surface flatness may increase, and tolerances or defects in disposing the elements may be reduced as compared to the example in which the elements are embedded in the second board 200.

In the printed circuit board 700A1 according to an example embodiment, an adhesive for disposing the first board 100 having a fine circuit may not be provided. The first board 100 may be disposed on the carrier 800 through a process described later, and thereafter, the first board 100 may be manufactured by building up the first insulating body 110, and accordingly, an adhesive layer may not be necessary, and processes and costs may be simplified.

The first insulating body 110 of the first board 100 may include a thermosetting resin such as an epoxy resin or a thermoplastic resin such as polyimide, such as, for example, Ajinomoto build-up film (ABF), and may not include a reinforcing material such as glass fiber. Alternatively, the first insulating body 110 may include a photosensitive insulating material, and for example, the first insulating body 110 may include a photo imageable dielectric (PID). Also, the second insulating body 210 of the second board 200 may include a thermosetting resin such as an epoxy resin or a thermoplastic resin such as polyimide, and the above-mentioned resin including a reinforcing material such as inorganic filler as silica and glass fiber, such as, for example, a prepreg, and an ABF. As described above, the first insulating body 110 of the first board 100 for implementing a fine circuit may not include a reinforcing material such as glass fiber, and the second board 200 may include glass fiber. Accordingly, stiffness of the second board 200 may be greater than that of the first board 100, such that stiffness of the printed circuit board 700A1 may be secured, and warpage may be easily controlled.

The first board 100 may have a structure in which the second board 200 may be disposed on one surface, and the plurality of first via layers 131, 132, 133, 134 and the through-via 300 may be exposed to the other surface. As described above, the first via layers 131, 132, 133, and 134 and the through-via 300 exposed to the other surface of the first board 100 may be connected to each other through electronic components mounted on the other surface of the first board 100 and an electrical connection metal. Also, after the first board 100 in the example embodiment is manufactured while being disposed on a carrier 800, an etching process may be performed while the carrier 800 is separated, and accordingly, a recess depth embedded from the other surface of the first insulating body 110 by a predetermined distance may be formed in the plurality of exposed first via layers 131, 132, 133, and 134 and the through-via 300.

In the manufacturing process using the carrier 800 of the printed circuit board 700A1 in FIG. 3, the copper foil 822 of the carrier 800 may be disposed on lower surfaces of the plurality of first via layers 131, 132, 133 and 134 and the through-via 300, defects may be prevented in a laser process. That is, when manufacturing a general printed circuit board, a metal layer on a lower surface may be configured to have a great thickness to prevent damages caused by the laser in the laser process, such that it may be difficult to implement a fine circuit. In the example embodiment, the carrier 800 may be removed after the copper foil 822 of the carrier 800 may be disposed on the lower surface to prevent laser damages and may function as a stopper layer, such that, despite the laser process, a fine circuit may be easily implemented. As described above, the thickness of the metal layer may be reduced, such that resolution may increase, and the thickness of the entire board may be reduced.

Also, as in the manufacturing process, the first board 100 having a fine circuit may be manufactured before the second board 200. Since the first board 100 has a fine circuit, possibility of damages or defects may be relatively higher than that of the second board 200, but since the first board 100 may be manufactured and inspected before the second board 200, manufacturing costs (F-cost) in a final product may be reduced, and a yield may improve.

By having the structure in which the second board 200 is disposed on one surface of the first board 100, the process may be simplified as compared to an embedded structure in which the first board 100 is embedded in the second board 200. For example, in the printed circuit board 700A1 according to an example embodiment, a cavity process may not be necessary, and a printed circuit board having a fine circuit may be implemented simply by a normal build-up process. Also, as compared to the structure in which the connection structure is built in the cavity, surface flatness of the surface on which electronic component are mounted may improve, such that warpage of the entire printed circuit board may be controlled.

The through-via 300 may penetrate the first insulating body 110 of the first board 100. Specifically, the through-via 300 may penetrate from one surface of the first board 100 on which the first insulating body 110 is in contact with the second board 200 to the other surface of the first board 200, in this case, the cross-sectional area of the through-via 300 may decrease from one surface to the other surface of the first board 100, and the width of the through-via 300 may have a tapered shape in which the width thereof may decrease from one surface to the other surface of the first board 100. As the through-via 300 collectively connects the first insulating body 110 as described above, a signal transmission distance may be shortened as compared to the stack-via structure, and via plating defects such as cracks may be prevented.

The first connection pad layer P1 may be disposed on the other surface of the first board 100 and may protrude from the other surface of the first board 100. The first connection pad layer P1 may be disposed on the through-via 300 and the first via layers 131, 132, 133 and 134 exposed from the other surface of the first board 100, and may cover the exposed surfaces of the through-via 300 and the first via layers 131, 132, 133, and 134.

A 2-1 wiring layer 221 disposed on the uppermost side among the plurality of second wiring layers 221, 222, 223, and 224 may be disposed on one surface of the first board 100. The 2-1 wiring layer 221 may be disposed to protrude below the 1-5 insulating layer 115 disposed on the lowermost side of the first insulating body 110 of the first board 100 and may be embedded in the insulating layer 211. Also, the 2-1 wiring layer 221 may be in contact with and electrically connected to the through-via 300.

The plurality of first via layers 131, 132, 133, and 134 may have different heights. One end of the plurality of first via layers 131, 132, 133, and 134 may be connected to one of the plurality of first wiring layers 121, 122, 123 and 124, and the other end may be exposed to the other surface of the first board 100. When the height of the plurality of first via layers 131, 132, 133, and 134 is the shortest distance from one end to the other end, the respective heights of the plurality of first via layers 131, 132, 133 and 134 may be different from each other. That is, among the plurality of first wiring layers 121, 122, 123, and 124, a via layer connected to a wiring layer adjacent to the other surface of the first board 100 may have a smaller height. For example, among the plurality of first via layers 131, 132, 133, and 134, the average height of the 1-1 via layer 131 connected to the 1-1 wiring layer 121 adjacent to the other surface of the first board 100 may be the smallest.

The through-via 300 penetrating through the first insulating body 110 may have a height greater than a height of each of the plurality of first via layers 131, 132, 133, and 134 penetrating at least a portion of the plurality of insulating layers 111, 112, 113, 114, and 115.

Hereinafter, the components of the printed circuit board 700A1 according to an example embodiment will be described with reference to the accompanying drawings.

Referring to FIG. 3, the first board 100 may include a first insulating body 110 including a plurality of first insulating layers 111, 112, 113, 114, and 115, a plurality of first wiring layers 121, 122, 123, and 124, and a plurality of first via layers 131, 132, 133, and 134. Each of the plurality of first wiring layers 121, 122, 123, and 124 may include a conductor pattern, and the plurality of first via layers 131, 132, 133 and 134 may electrically connect the conductor patterns of the plurality of first wiring layers 121, 122, 123, and 124 to each other, or may electrically connect a portion of the plurality of first wiring layers to the first connection pad layer P1.

The first board 100 may be configured in the form of a coreless or landless board. For example, the first board 100 may include a 1-1 insulating layer 111, a 1-1 wiring layer 121 protruding on the lower side of the 1-1 insulating layer 111, a 1-1 via layer 131 penetrating the 1-1 insulating layer 111 and having one end connected to the 1-1 wiring layer 121 and the other end exposed to the upper side of the 1-1 insulating layer 111, a 1-2 insulating layer 112 disposed on the lower surface of the 1-1 insulating layer 111 and covering the 1-1 wiring layer 121, a 1-2 wiring layer 122 protruding to the lower side of the 1-2 insulating layer 112, a 1-2 via layer 132 penetrating the 1-1 and 1-2 insulating layers 111 and 112 and having one end connected to the 1-2 wiring layer 121 and the other end exposed to the upper side of the 1-1 insulating layer 111, a 1-3 insulating layer 113 disposed on the lower surface of the 1-2 insulating layer 112 and covering the 1-2 wiring layer 122, a 1-3 wiring layer 123 penetrating the 1-1, 1-2, and 1-3 insulating layers 111, 112, and 113 and having one end connected to the 1-3 wiring layer 123 and the other end exposed to the upper side of the 1-1 insulating layer 111, a 1-4 insulating layer 114 disposed on the lower surface of the 1-3 insulating layer and covering the 1-3 wiring layer 123, a 1-4 wiring layer 124 protruding to the lower side of the 1-4 insulating layer 114, a 1-4 via layer 134 penetrating the 1-1, 1-2, 1-3 and 1-4 insulating layers 111, 112, 113, and 114 and having one end connected to the 1-4 wiring layer 124 and the other end exposed to the upper side of the 1-1 insulating layer 111, a 1-5 insulating layer disposed on the lower surface of the 1-4 wiring layer 124 covering the 1-4 wiring layer 124, and a through-via 300 penetrating each of the plurality of first insulating layers 111, 112, 113, 114, and 115 and having one end exposed to one surface of the first board 100 and the other end exposed to the other surface of the first board 100.

As described above, one ends of the plurality of first via layers 131, 132, 133, and 134 may be connected to the plurality of first wiring layers 121, 122, 123, and 124, respectively, but the other ends of the plurality of first via layers 131, 132, 133, and 134 may be exposed from the other surface of the first board 100. That is, the other end of each of the plurality of first via layers 131, 132, 133, and 134 may be exposed externally of the 1-1 insulating layer 111. As described above, the plurality of first via layers 131, 132, 133, and 134 in the first board 100 do not have a stack via structure and may have a structure directly exposed, a signal transmission path may be reduced, and defects may be prevented. For example, in the stack via structure, the phenomenon in which a signal is lost by passing through the interfacial surface of each plating layer may be prevented, cracks and delamination in which the plating layer is separated on the interfacial surface between the plating layers may be prevented.

The first board 100 may be built up while being disposed on the carrier 800. Accordingly, the first board 100 in the above-described final structure may be inverted upside down as compared to the state before the first board 100 is separated from the carrier 800.

The through-via 300 may penetrate each of the plurality of first insulating layers 111, 112, 113, 114, and 115. One end of the through-via 300 may be exposed to one surface of the first board 100, and may be contacted to the 2-1 wiring layer 221 of the second board 200, and the other end thereof may be exposed to the other end of the first board 100 and may be in contact with and connected to the first connection pad layer P1.

Referring to FIG. 3, the average height of the through-via 300 may be higher than that of the plurality of first via layers 131, 132, 133, and 134. In the example embodiment, a plurality of the through-via 300 and a plurality of first via layers 131, a plurality of first via layers 132, a plurality of first via layers 133, and a plurality of first via layers 134 may be disposed, rather than a single through-via 300 and a single first via layer being disposed. When the plurality of first via layers 131, the plurality of first via layers 132, the plurality of first via layers 133, and the plurality of first via layers 134 are disposed, the average height may refer to a height obtained by adding heights of the plurality of first via layers 131, adding heights of the plurality of first via layers 132, adding heights of the plurality of first via layers 133, and adding heights of the plurality of first via layers 134, dividing the added height by each number of the first via layers, and calculating an average value thereof. For example, the average height of the 1-1 via layer 131 may refer to a value obtained by calculating an average of the heights of the entire vias connecting the 1-1 wiring layer 121 to the first connection pad layer P1.

In the example embodiment, "height" may refer to a value obtained by measuring the heights of five arbitrary positions of an object and obtaining an average value thereof. For example, the height of the 1-1 via layer 131 may refer to an average height obtained by measuring the shortest distance from one surface of the 1-1 via layer 131 to the other side in five arbitrary regions of one surface of the 1-1 via layer 131 and dividing the sum of the shortest distances by five.

Also, referring to FIG. 3, the plurality of first via layers 131, 132, 133, and 134 may have different average heights. That is, among the plurality of first via layers 131, 132, 133, and 134, a via layer connected to a wiring layer adjacent to the other surface of the first board among the plurality of first wiring layers 121, 122, 123 and 124 may be smaller. For example, the average height of the 1-4 via layers 134 may be higher than the average height of the 1-3 via layers 133, the average height of the 1-3 via layers 133 may be higher than the average height of the 1-3 via layers 133, and the average height of the 1-2 via layer 132 may be higher than the average height of the 1-1 via layer 131.

As a material of the plurality of first insulating layers 111, 112, 113, 114, and 115 forming the first insulating body 110, an insulating material may be used, and as the insulating material, a thermosetting resin such as an epoxy resin or a thermoplastic resin such as polyimide, such as, for example, ABF, may be included, and a reinforcing material such as fiber glass may not be included. Alternatively, the first insulating body 110 may include a photosensitive insulating material, such as, for example, PID. The first insulating body 110 may have stiffness less than that of the second insulating body 210. The number of the plurality of first insulating layers 111, 112, 113, 114, and 115 may be greater or less than the illustrated example in the drawings.

A metal material may be used as a material of the plurality of first wiring layers 121, 122 123, and 124, and as the metal material, copper (Cu), aluminum (Al), silver (Ag), tin (Sn), gold (Au), nickel (Ni), lead (Pb), titanium (Ti), or alloys thereof may be used. Each of the plurality of first wiring layers 121, 122 123, and 124 may perform various functions according to a design. For example, the plurality of first wiring layers 121, 122 123, and 124 may include a ground pattern, a power pattern, and a signal pattern. Each of the patterns may have a line shape, a plane shape, or a pad shape. The plurality of first wiring layers 121, 122 123, and 124 may be formed by a plating process such as an additive process (AP), a semi AP (SAP), a modified SAP (MSAP), a tenting (TT), or the like, and accordingly, each of the plurality of first wiring layers 121, 122, 123, and 124 may include a seed layer, an electroless plating layer, and an electrolytic plating layer formed based on the seed layer.

A metal material may be used as a material of the plurality of first via layers 131, 132, 133, and 134, and as the metal material, copper (Cu), aluminum (Al), silver (Ag), tin (Sn), gold (Au), nickel (Ni), lead (Pb), titanium (Ti), or alloys thereof may be used. The plurality of first via layers 131, 132, 133, and 134 may also include a signal connection via, a ground connection via, and a power connection via according to a design. Each of the wiring vias of the plurality of first via layers 131, 132, 133, and 134 may be completely filled with a metal material, or the metal material may be formed along the wall surface of the via hole. Each of the plurality of first via layers 131, 132, 133, and 134 may have a tapered shape. The plurality of first via layers 131, 132, 133, and 134 may be formed by a plating process, such as, for example, AP, SAP, MSAP, or TT, and may thus include a seed layer, an electroless plating layer, and an electrolytic plating layer formed based on the seed layer. The number of the plurality of first via layers 131, 132, 133, and 134 may be greater or less than the illustrated example in the drawings.

The second board 200 may include the second insulating body 210 including a plurality of second insulating layers 211, 212, 213, and 214, a plurality of second wiring layers 221, 222, 223, and 224, a plurality of second via layers 231, 232, 233, and 234 and a second connection pad layer P2. Each of the plurality of second wiring layers 221, 222, 223, and 224 may include a conductor pattern, and the plurality of second via layers 231, 232, 233, and 234 may electrically connect the conductor patterns to each other or may electrically connect the conductor patterns to the second connection pad layer P2. The second board 200 may be configured in the form of a coreless board. For example, the second board 200 may include a 2-1 insulating layer 211, a 2-1 wiring layer 221 embedded in the upper side of the 2-1 insulating layer 211, a 2-1 wiring layer 222 disposed on the lower surface of the 2-1 insulating layer 211, a 2-1 via layer 231 penetrating the 2-1 insulating layer 211 and connecting the 2-1 wiring layer 221 to the 2-1 wiring layer 222, a 2-2 insulating layer 212 disposed on the lower surface of the 2-1 insulating layer 211 and covering the 2-2 wiring layer 222, a 2-3 wiring layer 223 disposed on the lower surface of the 2-2 insulating layer 212, a 2-2 via layer 232 penetrating the 2-2 insulating layer 212 and connecting the 2-2 wiring layer 222 to the 2-3 wiring layer 223, a 2-3 insulating layer 213 disposed on the lower surface of the 2-2 insulating layer 212 and covering the 2-3 wiring layer 223, a 2-4 wiring layer 224 disposed on the lower surface of the 2-3 insulating layer 213, a 2-3 via layer 233 penetrating the 2-3 insulating layer 213 and connecting the 2-3 wiring layer 223 to the 2-4 wiring layer 224, a 2-4 insulating layer 214 disposed on the lower surface of the 2-3 insulating layer 213 and covering the 2-4 wiring layer 224, a second connection pad layer P2 disposed on the lower surface of the 2-4 insulating layer 214, and a 2-4 via layer 234 penetrating the 2-4 insulating layer 214 and connecting the 2-4 wiring layer 224 to the second connection pad layer P2.

The 2-1 wiring layer 221 embedded in the upper side of the 2-1 insulating layer 211 may be disposed on the 1-5 insulating layer 115 exposed to one surface of the first board 100. Also, even when the first board 100 includes a larger number or a smaller number of insulating layers, the 2-1 wiring layer 221 may be disposed on one surface of the first board 100.

The average thickness of the plurality of first insulating layers 111, 112, 113, 114, and 115 forming the first insulating body 110 may be less than the average thickness of the plurality of second insulating layers 211, 212, 213, and 214. For example, a value obtained by calculating the thickness of each of the 1-1 to 1-5 insulating layers 111, 112, 113, 114 and 115, and calculating the average value thereof may be smaller than the value obtained by calculating the thickness of each of the 2-1 to 2-4 insulating layer 211, 212, 213, and 214 and calculating the average value thereof.

The thickness of at least one of the plurality of first insulating layers 111, 112, 113, 114, and 115 included in the first insulating body 110 may be less than the thickness of at least one of the two insulating layers 211, 212, 213 and 214. Alternatively, the thickness of each of the plurality of first insulating layers 111, 112, 113, 114, 115 included in the first insulating body 110 may be less than the thickness of each of the plurality of second insulating layers 211, 212, 213, and 214 included in the second insulating body 210.

Therefore, the first wiring layers 121, 122, 123, and 124 including a high-density circuit, higher than that of the second wiring layers 221, 222, 223, and 224, may be disposed between the plurality of first insulating layers 111, 112, 113, 114, and 115. The configuration of including a high-density circuit may indicate that a fine pitch is formed and/or that a distance between layers may be relatively small. As the thickness of at least one of the plurality of first insulating layers 111, 112, 113, 114 and 115 is less than the thickness of at least one of the plurality of second insulating layers 211, 212, 213 and 214, the second wiring layers 221, 222, 223, and 224 may have a higher density such that the second wiring layers 221, 222, 223, and 224 may have a fine wiring structure, and a signal distance between electronic components may be effectively shortened through the fine wiring structure.

In the example embodiment, the "thickness" may refer to a value obtained by measuring the thicknesses of five arbitrary regions of one of the layers and obtaining an average value thereof. For example, the thickness of the 1-1 insulating layer 111 may refer to an average thickness obtained by measuring the shortest distances from the upper surface to the lower surface of the 1-1 insulating layer 111 in five arbitrary regions of the upper surface of the 1-1 insulating layer 111 and dividing the sum of the shortest distances by five.

An insulating material may be used as a material of the plurality of second insulating layers 211, 212, 213, and 214 included in the second insulating body 210. For example, an insulating material of the plurality of second insulating layers 211, 212, 213, 214 may include a thermosetting resin such as an epoxy resin or a thermoplastic resin such as polyimide, and the above-mentioned resin including a reinforcing material such as inorganic filler as silica and glass fiber, such as, for example, a prepreg, and an ABF. The number of the plurality of second insulating layers 211, 212, 213, and 214 may be greater or less than the illustrated example in the drawings. In some cases, the plurality of second insulating layers 211, 212, and 213 may include a photosensitive insulating material.

As described above, when a prepreg including a reinforcing material such as glass fiber is used as a material of the plurality of second insulating layers 211, 212, 213, and 214, stiffness of the second insulating body 210 may be larger than that of the first insulating body 110. In this case, by compensating for the relatively lower stiffness of the first insulating body 110 of which workability may need to be secured as the first insulating body 110 includes the high-density circuit, the second insulating body 210 may improve stiffness of the printed circuit board 700A1.

Also, the layer most spaced apart from the first insulating body 110 among the plurality of second insulating layers 211, 212, 213, and 214 may include the same insulating material as that of the first insulating body 110. That is, the 2-4 insulating layer 214 exposed to the other surface of the second board 200 among the plurality of second insulating layers 211, 212, 213, and 214 may include the same material as that of the plurality of first insulating layers 111, 112, 113, 114, and 115. In this case, the 2-1, 2-2, and 2-3 insulating layers 211, 212, and 213 may include a material having higher stiffness, such that stiffness of the printed circuit board may be secured, and as the first insulating body 110 and the second insulating layer 214 include the same insulating material, warpage of the entire printed circuit board may be prevented. Specifically, when the upper and lower insulating materials of the printed circuit board 700A1 are formed of different materials, warpage may occur due to a difference in coefficient of thermal expansion and stiffness, and as the first insulating body 110 and the 2-4 insulating layer 214 disposed on the upper and lower portions of the printed circuit board 700A1 include the same insulating material, warpage of the printed circuit board 700A1 may be prevented. Also, when the 1-1 insulating layer 111 and the 2-4 insulating layer 214 include the same insulating material, warpage may be effectively prevented.

A metal material may be used as a material of the plurality of second wiring layers 221, 222, 223, and 224 and the second connection pad layer P2, and as the metal material, copper (Cu), aluminum (Al), silver (Ag), tin (Sn), gold (Au), nickel (Ni), lead (Pb), titanium (Ti), or alloys thereof may be used. Each of the plurality of second wiring layers 221, 222, 223, and 224 may perform various functions according to a design. For example, the plurality of second wiring layers 221, 222, 223, and 224 may include a ground pattern, a power pattern, and a signal pattern. Each of the patterns may have a line shape, a plane shape, or a pad shape. The plurality of second wiring layers 221, 222, 223, and 224 may be formed by a plating process such as AP, SAP, MSAP, or TT, and accordingly, each of the plurality of second wiring layers 221, 222, 223, and 224 may include a seed layer, an electroless plating layer, and an electrolytic plating layer formed based on the seed layer. The plurality of second wiring layers 221, 222, 223, and 224 may further include a primer copper foil. The number of the plurality of second wiring layers 221, 222, 223, and 224 may be greater or less than the illustrated example in the drawings.

A metal material may be used as a material of the plurality of second via layers 231, 232, 233, and 234, and as the metal material, copper (Cu), aluminum (Al), silver (Ag), tin (Sn), gold (Au), nickel (Ni), lead (Pb), titanium (Ti), or alloys thereof may be used. The plurality of second via layers 231, 232, 233, and 234 may also include a signal connection via, a ground connection via, and a power connection via, respectively, according to a design. Each of the vias of the plurality of second via layers 231, 232, 233, and 234 may have a structure in which each via hole is filled with a metal material. Each of the plurality of second via layers 231, 232, 233, and 234 may have a tapered shape. The plurality of second via layers 231, 232, 233, and 234 may be formed by a plating process, such as, for example, AP, SAP, MSAP, and TT. Accordingly, the plurality of second via layers 231, 232, 233, and 234 may include a seed layer, an electroless plating layer, and an electrolytic plating layer formed based on the seed layer. The number of the plurality of second via layers 231, 232, 233, and 234 may be greater or less than the illustrated example in the drawings.

The plurality of first wiring layers 121, 122, 123, and 124 of the first board 100 may have density relatively higher than that of the plurality of second wiring layers 221, 222, 223, and 224 of the second board 200. Here, the configuration of including the high-density circuit may indicate that a relatively fine pitch is formed and/or that a distance between layers may be relatively small.

As an example of a high-density circuit, the plurality of first wiring layers 121, 122, 123, and 124 of the first board 100 may have a fine average pitch as compared to the plurality of second wiring layers 221, 222, 223, and 224.

Here, the pitch may refer to a distance from the center of a conductive pattern to the center of another adjacent conductive pattern in each wiring layer disposed on the same layer. Also, in the example embodiment, the pitch of the plurality of first wiring layers 121, 122, 123, and 124 and the plurality of second wiring layers 221, 222, 223, and 224 does not refer to the pitch of each of the wiring layers, and may refer to an average pitch. That is, the configuration in which the plurality of first wiring layers 121, 122, 123, and 124 of the first board 100 may have a relatively finer pitch as compared to that of the plurality of second wiring layers 221, 222, 223 and 224 of the second board 200 may indicate that the average value of pitches in each of the plurality of first wiring layers 121, 122, 123, and 124 may be smaller than the average value of pitches in each of the plurality of second wiring layers 221, 222, 223, and 224.

For example, an average pitch of at least one of the plurality of first wiring layers 121, 122, 123, and 124 of the first board 100 is defined as a first pitch, and the average pitch of at least one of the plurality of second wiring layers 221, 222, 223, and 224 is defined as a second pitch, the first pitch may be smaller than the second pitch.

For another example of a high-density circuit, an average distance between the plurality of first wiring layers 121, 122, 123, and 124 of the first board 100 is defined as a first distance, and an average distance between the plurality of second wiring layers 221, 222, 223, and 224 of the second board 200 is defined as a second distance, the first distance may be smaller than the second distance. Here, the term "distance" may refer to an interlayer spacing between the plurality of first wiring layers 121, 122, 123, and 124 and between the plurality of second wiring layers 221, 222, 223 and 224.

As described above, the configuration in which the plurality of first wiring layers 121, 122, 123, and 124 have higher-density circuits than those of the plurality of second wiring layers 221, 222, 223, and 224 may indicate that the plurality of first wiring layers 121, 122, 123, and 124 may be implemented with a fine circuit. That is, as the first board 100 is implemented as a fine circuit, the first board 100 may function as a connection structure or a bridge for performing a connection between electronic components 510 and 520, and a fine width and spacing may be formed according to the scale of the terminals formed on the electronic components 510 and 520.

In the printed circuit board 700A1 according to an example embodiment, the second board 200 having a relatively coarse circuit may be disposed on one surface of the first board 100 having a fine circuit. In the printed circuit board 700A1 in FIG. 3, the second board 200 may be disposed on the front surface of the first board 100 such that one surface of the first board 100 may be in contact with one surface of the second board 200.

The first connection pad layer P1 may be disposed on the other surface of the first board 100. The plurality of first via layers 131, 132, 133, and 134 and the through-via 300 may be exposed to the other surface of the first board 100, and the first connection pad layer P1 may be exposed to the other surface of the first board 100 to cover the exposed surfaces of the through-vias 300 and the through-vias 300. The first connection pad layer P1 may connect the first board 2100 to other external components such as electronic components. A metal material may be used as a material of the first connection pad layer P, and as the metal material, copper (Cu), aluminum (Al), silver (Ag), tin (Sn), gold (Au), nickel (Ni), lead (Pb), titanium (Ti), or alloys thereof may be used.

The second connection pad layer P2 may protrude to the other surface of the second board 200, and may connect the second board 200 to other external components such as a main board. A metal material may be used as a material of the second connection pad layer P, and as the metal material, copper (Cu), aluminum (Al), silver (Ag), tin (Sn), gold (Au), nickel (Ni), lead (Pb), titanium (Ti), or alloys thereof may be used.

The first and second connection pad layers P1 and P2 may be formed by a plating process, such as, for example, AP, SAP, MSAP, and TT, and accordingly, the first and second connection pad layers P1 and P2 may include a seed layer, an electroless plating layer, and an electrolytic plating layer formed based on the seed layer. Also, the first connection pad layer P1 may be formed by the second copper foil 822 partially etched and remaining in the process described later.

First and second passivation layers 410 and 420 having openings may be disposed on the other surfaces of the first board 100 and the second board 200, respectively. For example, the first passivation layer 410 having a first opening may expose at least a portion of the first connection pad layer P1 externally, and the second passivation layer 420 having a second opening may expose at least a portion of the connection pad layer P2 externally.

The other descriptions are the same as in the aforementioned example embodiment, and will thus not be repeated.

Figure 4:
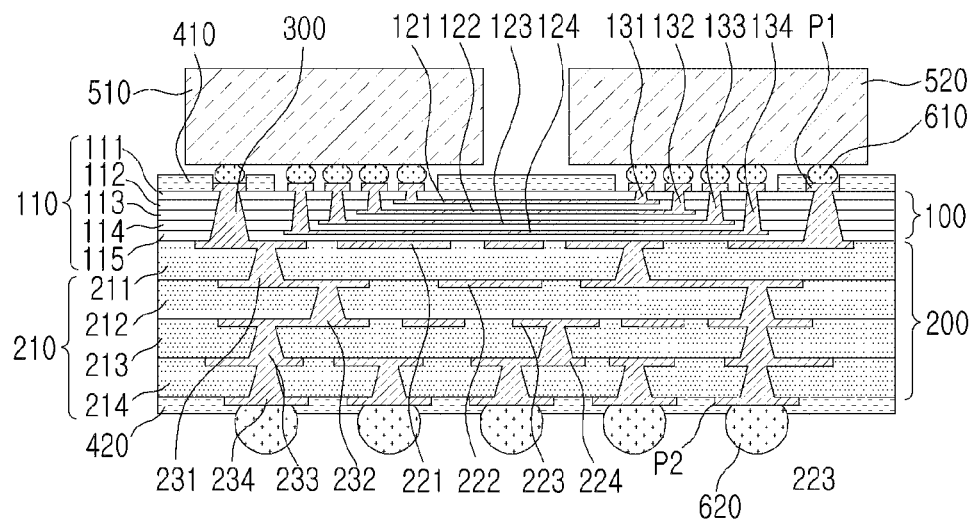
FIG. 4 is a cross-sectional diagram illustrating a modified example of a printed circuit board in FIG. 3.

FIG. 4 is a cross-sectional diagram illustrating a modified example of a printed circuit board in FIG. 3.

Referring to the drawing, a printed circuit board 700A2 according to the modified example, as compared to the printed circuit board 700A1 according to the above-described example, may further include a plurality of electronic components 510 and 520 surface-mounted on the other surface of the first board 100 through a first electrical connection metal 610. At least a portion of each of the plurality of electronic components 510 and 520 may be electrically connected to each other through the plurality of first wiring layers 121, 122, 123, and 124 in the first board 100. Also, the plurality of electronic components 510 and 520 may be electrically connected to the 2-1 wiring layer 221 of the second board 200 using the through-via 300. Each of the plurality of electronic components 510 and 520 may be implemented as an integrated circuit (IC) die in which hundreds to millions of devices are integrated in a single chip. For example, the plurality of electronic components 510 and 520 may include a processor chip such as a central processor (e.g., CPU), a graphics processor (e.g., GPU), a field programmable gate array (FPGA), a digital signal processor, an encryption processor, a microprocessor, a microcontroller, and specifically, an application processor (AP), but an example embodiment thereof is not limited thereto, and alternatively, the plurality of electronic components 510 and 520 may be implemented as a memory such as other volatile memories (e.g., DRAM), non-volatile memories (e.g., ROM), and a flash memory, or a logic such as an application-specific IC (ASIC). If desired, the plurality of electronic components 510 and 520 may be implemented as a passive component in the form of a chip, such as, for example, a capacitor in the form of a chip such as a multilayer ceramic capacitor (MLCC), or an inductor in the form of a chip such as a power inductor (PI). The plurality of electronic components 510 and 520 may be disposed such that a surface on which a connection pad (not illustrated) may be directly downwardly, and an opposite side thereof may be directed upwardly. The connection pads of the plurality of electronic components 510 and 520 may include a metal material such as copper (Cu) or aluminum (Al), and may be connected to the first electrical connection metal 610. The first electrical connection metal 610 may be disposed on the other side of the first board 100, and the second electrical connection metal 620 may be disposed on the other side of the second board 200. The first electrical connection metal 610 may be disposed on the first connection pad layer P1 exposed externally through the first opening of the first passivation layer 410. The second electrical connection metal 620 may be disposed on the other surface of the second board 200 and may be disposed on the second connection pad layer P2 exposed from the second opening of the second passivation layer 420. The first and second electrical connection metals 610 and 620 may include tin (Sn) or an alloy including tin (Sn), such as, for example, solder.

Although not illustrated, a bump including copper (Cu) may be further disposed between terminals of the electronic components 510 and 520 and the first electrical connection metal 610. Also, an insulating film (not illustrated) including an insulating resin may be disposed between the first board 100 and the electronic components 510 and 520 such that damages to the first electrical connection metal 610 may be prevented and may be insulated from the outside.

The other descriptions are the same as in the aforementioned example embodiment, and will thus not be repeated.

Figure 5:
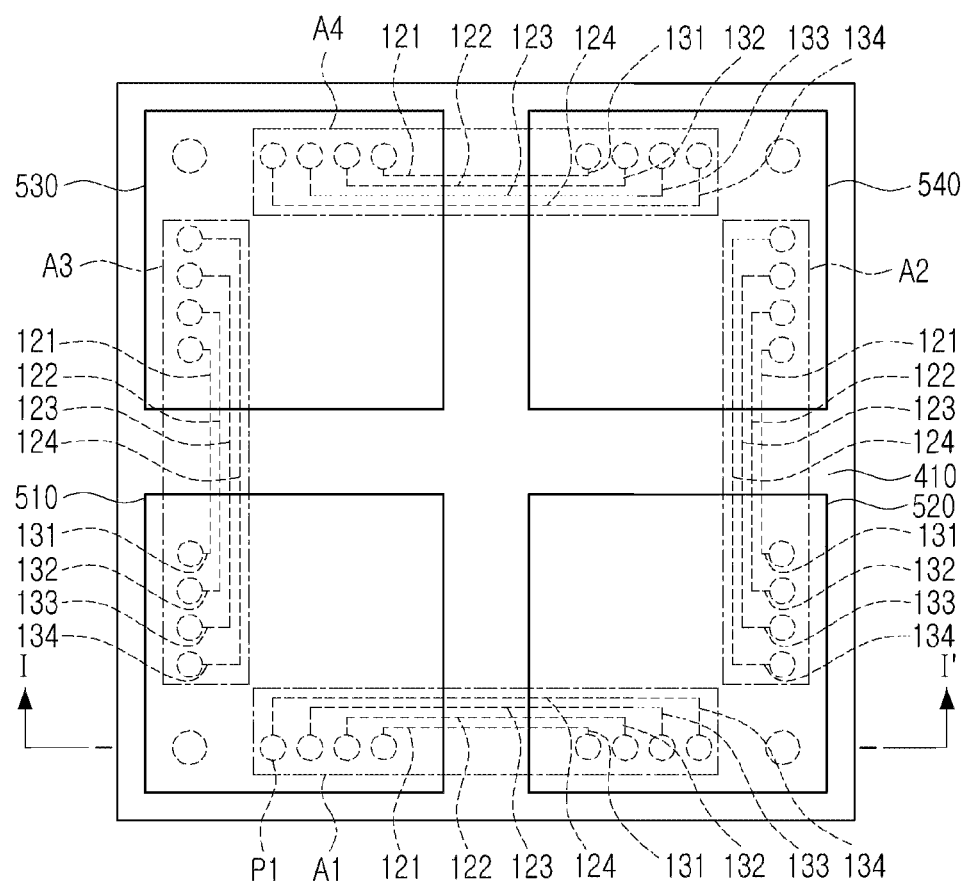
FIG. 5 is a plan diagram illustrating the printed circuit board in FIG. 4, viewed from the above.

FIG. 5 is a cross-sectional diagram illustrating a printed circuit board in FIG. 4, viewed from the above.

Referring to FIG. 5, the plurality of electronic components 510 and 520 and also additional electronic components 530 and 540 may be further mounted on the first board 100. FIG. 4 illustrating the modified example 700A2 of the above-described printed circuit board may correspond to the cross-sectional diagram taken along line I-I' in FIG. 5.

Referring FIG. 5, a plurality of electronic components 510, 520, 530, and 540 may be mounted on the other surface of the first board 100, and the plurality of electronic components 510, 520, 530, and 540 may be electrically connected to each other by the plurality of first wiring layers 121, 122, 123, and 124. That is, the plurality of first wiring layers 121, 122, 123, and 124 including fine circuits may be disposed in the plurality of first to fourth regions A1, A2, A3, and A4 in the first board 100. Each of the plurality of first wiring layers 121, 122, 123, and 124 disposed in the plurality of regions may electrically connect the plurality of electronic components 510, 520, 530, and 540 to each other. For example, the plurality of electronic components 510 and 520 may be electrically connected to each other by a first wiring area A1 including the plurality of first wiring layers 121, 122, 123, and 124, the plurality of electronic components 520 and 540 may be electrically connected to each other by a second wiring area A2 including the plurality of first wiring layers 121, 122, 123 and 124, the plurality of electronic components 510 and 530 may be electrically connected to each other by a third wiring area A3 including the plurality of first wiring layers 121, 122, 123, and 124, and the plurality of electronic components 530 and 540 may be electrically connected to each other by a fourth wiring area A4 including the plurality of first wiring layers 121, 122, 123, and 124.

As described above, when the plurality of first wiring layers 121, 122, 123, and 124 are disposed in the plurality of first to fourth wiring areas A1, A2, A3, and A4 of the first board 100, there may be an advantage in process as compared to the structure in which a connection structure having a fine circuit is embedded. That is, when the connection structure is embedded in a plurality of regions, after the cavity or through-portion is processed in each region, the connection structure may need to be embedded after being accurately placed in the corresponding position, and accordingly, a precise placement process for cavity process and matching of the position of connection structure may be necessary. In this case, defects may occur due to mismatching between the connection structure and the cavity.

Differently from the above example, in the example embodiment, since the plurality of first wiring layers 121, 122, 123, and 124 may be disposed in the first board 100 in a build-up manner, the above-described precise process for matching may not be necessary. Also, since the plurality of first wiring layers 121, 122, 123, and 124 may be simultaneously and collectively disposed in the first to fourth wiring areas A1, A2, A3, and A4, respectively, the process may be simplified, and an insulating layer process process such as a cavity process may not be necessary.

In the diagram in FIG. 5, the plurality of first wiring layers 121, 122, 123, and 124 and the plurality of first via layers 131, 132, 133, and 134 may appear to be disposed on the same plane. However, the example is a schematic representation of the connection structure of each conductive layer, and the layers may be substantially disposed in different layers. The detailed structure in the vertical direction is illustrated in FIGS. 3 and 4.

The diagram in FIG. 5 illustrates the structure in which the plurality of first wiring layers 121, 122, 123, and 124 including fine circuits are disposed in the plurality of first to fourth regions A1, A2, A3, and A4, and accordingly freedom in design may be secured as compared to a general printed circuit board in which a bridge or connection structure is embedded in a cavity. When the bridge or connection structure is embedded in a printed circuit board, the printed circuit board may be limited to the shape of the bridge or connection structure manufactured in advance, and the bridge or connection structure may be generally manufactured in a rectangular shape in consideration of productivity and yield, whereas the plurality of first wiring layers 121, 122, 123, and 124 and the plurality of first to fourth regions A1, A2, A3 and A4 including the fine circuits in the example embodiment may not be limited to any particular shape or size. Accordingly, the layers and regions may be designed and applied in various shapes if desired, such as a rectangular shape or a triangular shape, such that freedom in design may improve.

The other descriptions are the same as in the aforementioned example embodiment, and will thus not be repeated.

FIGS. 6 to 15 are diagrams illustrating an example of processes of manufacturing the printed circuit board in FIG. 3.

Figure 6:
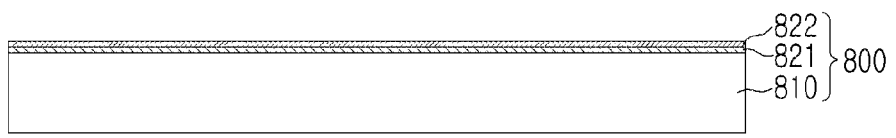
FIGS. 6 to 15 are diagrams illustrating an example of processes of manufacturing the printed circuit board in FIG. 3.

Referring to FIG. 6, a carrier 800 in which first and second copper foils 821 and 822 are formed on an insulating layer 810 may be prepared.

Figure 7:
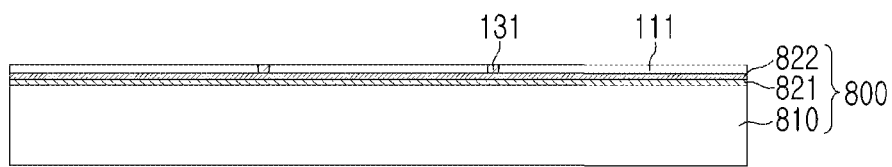

Referring to FIG. 7, the 1-1 insulating layer 111 may be disposed on the second copper foil 822 of the carrier 800, and the 1-1 via layer 131 and the 1-1 wiring layer 121 may be disposed through an insulating layer process and a plating process.

As a method of processing the insulating layer, a method of processing an insulating layer such as $CO_2$ laser processing or blast processing may be used without limitation. In this case, the second copper foil 822 having a relatively thick thickness may function as a stopper layer during the laser or blast process, such that a process of increasing the thickness of the stopper layer may not be necessary.

Figure 8:
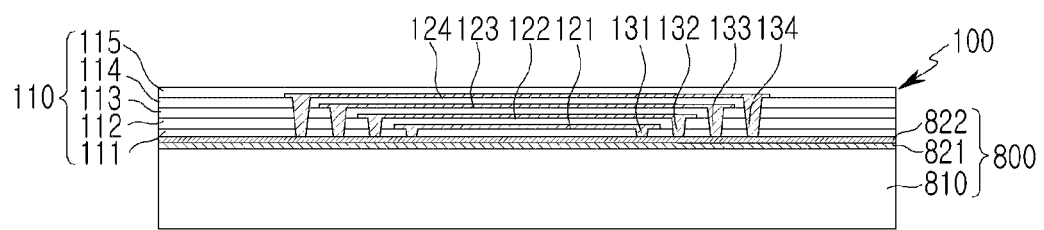

Referring to FIG. 8, by repeating the above-described process, a plurality of first wiring layers 121, 122, 123, and 124, a plurality of first via layers 131, 132, 133 and 134, and a plurality of first insulating layers 111, 112, 113, 114, and 115 having high-density circuits may be disposed.

Figure 9:
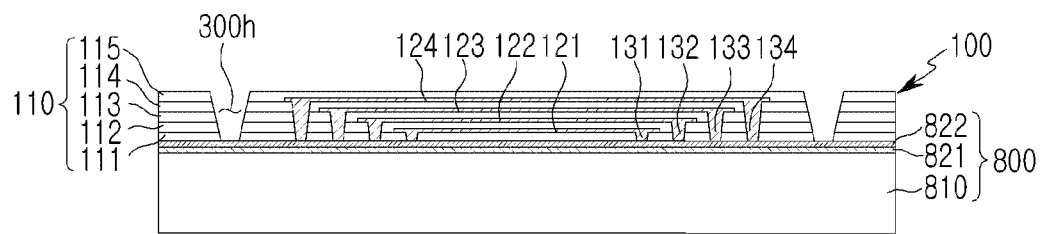
Figure 10:
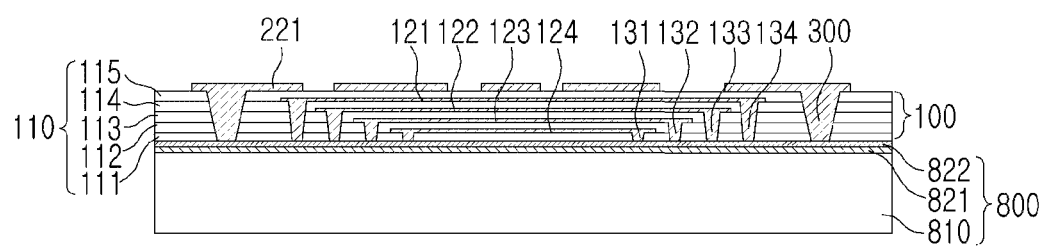

Referring to FIGS. 9 and 10, a through-via 300 penetrating each of the plurality of first insulating layers 111, 112, 113, 114 and 115 may be disposed. The through-via 300 may be formed by forming the through-via hole 300h and filling the through-via hole 300h by plating or plating along the internal wall of the through-via hole 300h. As the method of processing the through-via hole 300h, a method of processing an insulating layer such as a $CO_2$ laser process or blast process may be used without limitation, and the through-via hole 300h may be configured to penetrate the plurality of first insulating layers 111, 112, 113, 114, and 115, and accordingly, the through-via hole 300h may be exposed to one surface of the first board 100. In this case, a second copper foil 822 disposed on the other side of the first board 100 and having a relatively thick thickness may function as a stopper layer in the laser or blast process for the through-via hole 300h, and a process of increasing the thickness of the stopper layer may not be necessary. Also, the through-via hole 300h may be processed in a direction from one surface of the first board 100 to the other surface, and the through-via hole 300h and the through-via 300 may have a tapered shape in which a cross-sectional area thereof may decrease from the one surface of the first board 100 to the other surface. Thereafter, the 2-1 wiring layer 221 connected to the through-via 300 may be disposed on one surface of the first board 100 through patterning and may be in contact with the through-via 300.

Figure 11:
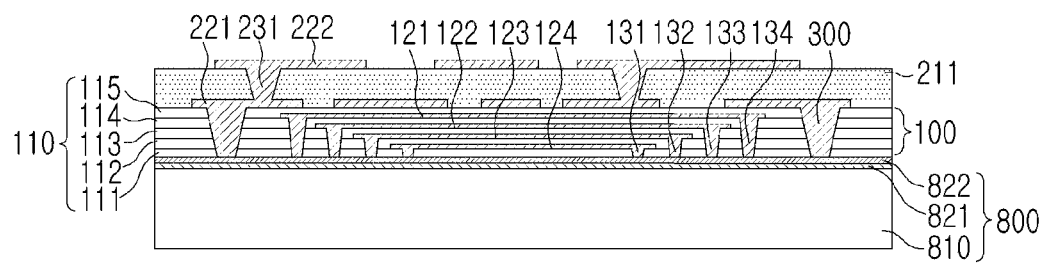

Referring to FIG. 11, the 2-1 insulating layer 211 covering the 2-1 wiring layer 221 may be disposed on one surface of the first board 100, and the 2-1 via layer 231 and the 2-2 wiring layer 222 may be disposed through the process and plating for the 2-1 insulating layer 211.

Figure 12:
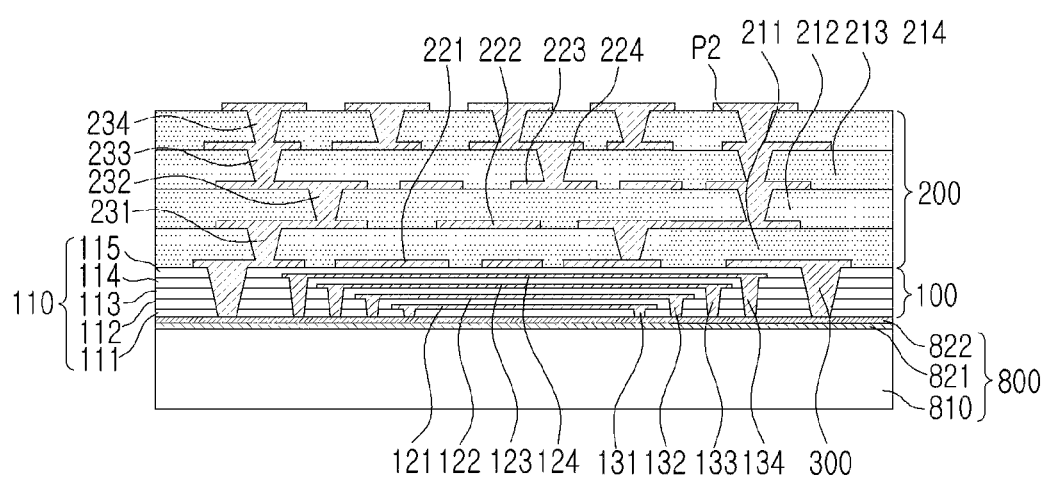

Referring to FIG. 12, the second board 200 including the plurality of second insulating layers 211, 212, 213, and 214, the plurality of second wiring layers 221, 222, 223, and 224, the plurality of second via layers 231, 232, 233, and 234, and the second connection pad layer P2 may be disposed through a build-up process on one surface of the first board 100.

Figure 13:
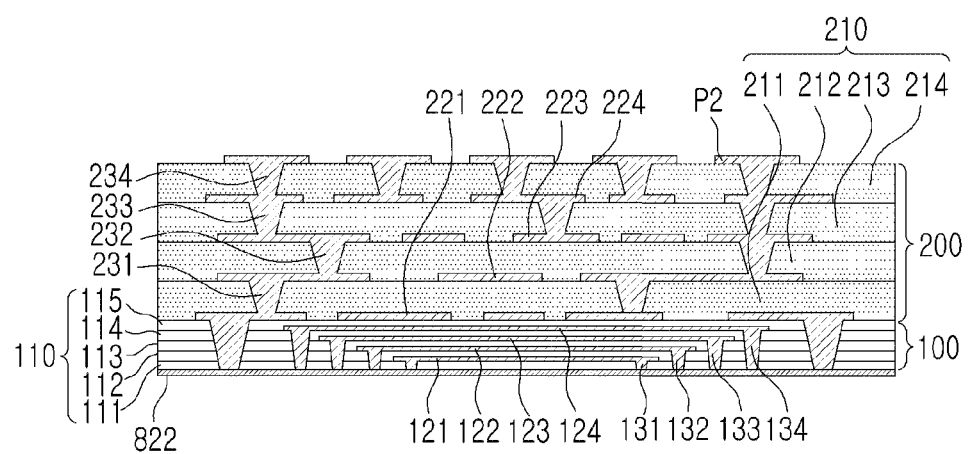
Figure 14:
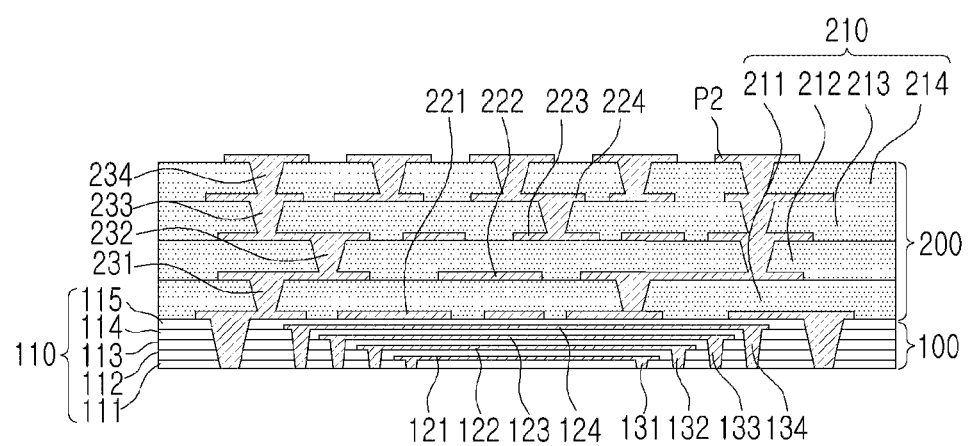

Referring to FIG. 13, the insulating layer 810 and the first copper foil 821 may be removed through separation of the first and second copper foils 821 and 822. Thereafter, referring to FIG. 14, the second copper foil 822 may be removed through an etching process. Due to the removal of the second copper foil 822, ends of the plurality of first via layers 131, 132, 133, and 134 and through-vias 300 may be exposed from the other surface of the first board 100.

Figure 15:
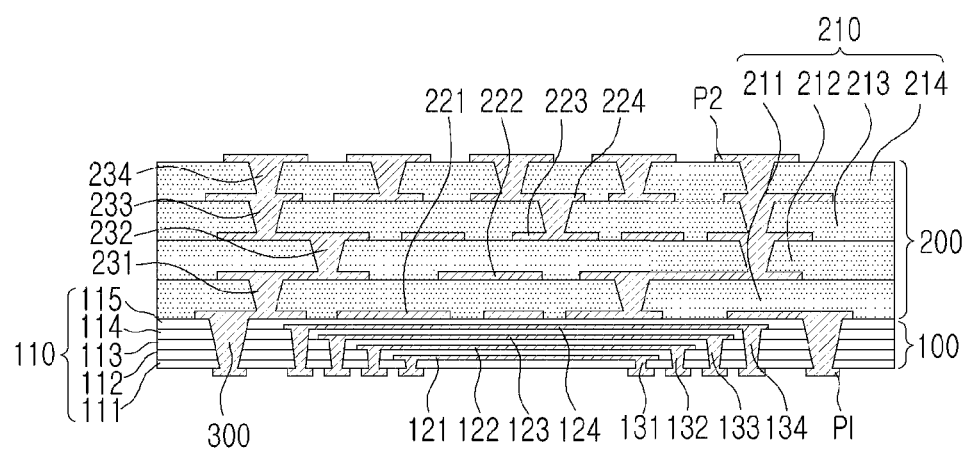

Referring to FIG. 15, the first connection pad layer P1 may be disposed on the other surface of the first board 100, and may be in contact with and connected to ends of the plurality of exposed first via layers 131, 132, 133, and 134 and the exposed through-via 300. Accordingly, the printed circuit board 700A1 according to the example in FIG. 3 may be manufactured.

In FIG. 15 the structure in which the first connection pad layer P1 is disposed on the other surface of the first board 100 after the second copper foil 822 is entirely removed is illustrated, but in the process in FIG. 12, the copper foil 822 may not be entirely removed. That is, the region of the second copper foil 822 in contact with the ends of the plurality of first via layers 131, 132, 133 and 134 and the through-via 300 may not be etched and may remain, and the remaining second copper foil 822 may become the first connection pad layer P1. In this case, an etching resist such as a dry film resist may be used to etch only a partial region.

Figure 16:
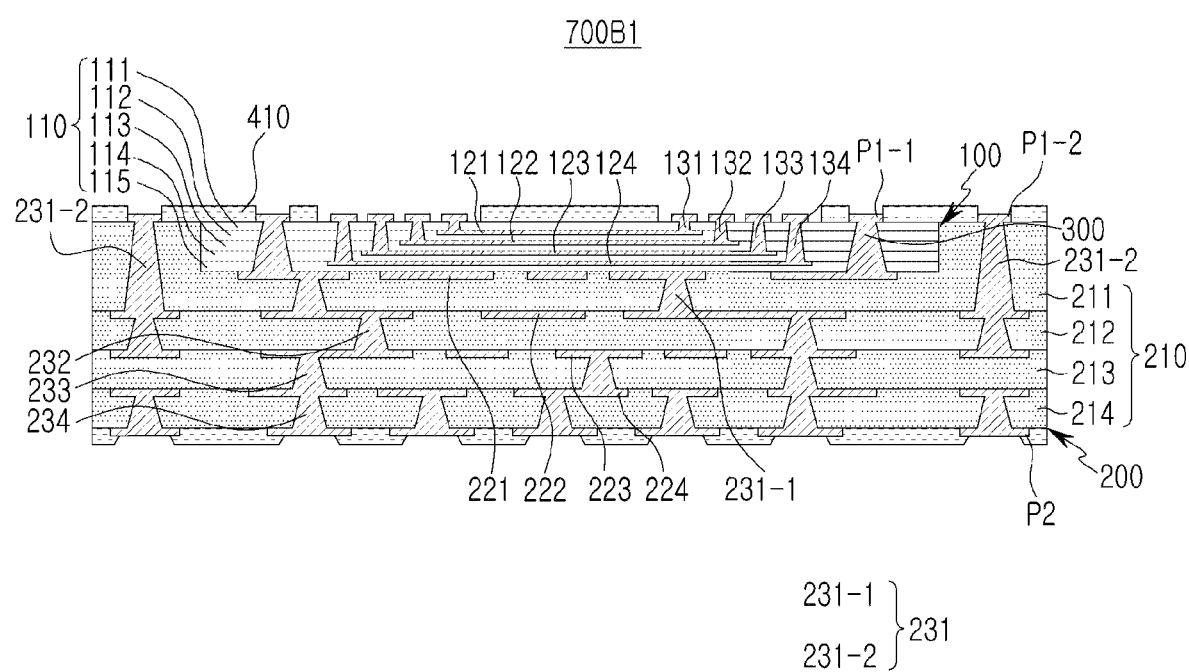
FIG. 16 is a cross-sectional diagram illustrating another example of a printed circuit board.

FIG. 16 is a cross-sectional diagram illustrating another example of a printed circuit board.

In the printed circuit board 700B1 according to another example embodiment in FIG. 16, the arrangement relationship between the first and second boards and the shapes of the 21 insulating layer 211 and the 2-1 via layer 231 may be different from the examples in the printed circuit board 700A1 according to the aforementioned example embodiment.

Referring to FIG. 16 illustrating the printed circuit board 700B1 according to another example embodiment, when the 2-1 insulating layer 211 of the second board 200 is disposed on one surface of the first board 100 after the first board 100 is manufactured, the 2-1 insulating layer 211 may also cover the side surface of the first board 100. Accordingly, one surface of the second board 200 may fill the first board 100 and may have a step. That is, in the final structure, the first board 100 may not be disposed on the front surface of the second board 200, and may be locally disposed on one surface of the second board 200. Also, the 2-1 via layer 231 may include first and second wiring vias 231-1 and 231-2 having different heights.

Also, in the printed circuit board 700B1 according to another example embodiment, a portion of one surface of the second board 200 and the other surface of the first board 100 may be coplanar with each other. In this case, the other portion of one surface of the second board 200 may be in contact with one surface of the first board 100 due to the step.

Referring to the structure in FIG. 16, the second wiring via 231-2 may be exposed from one surface of the second board 200, and the first connection pad layer P1 may include a 1-1 connection pad layer P1-1 and a 1-2 connection pad layer P1-2. The 1-2 connection pad layer P1-2 may be disposed on one surface of the second board 200 and may cover the exposed second wiring via 231-2. By including the above-described structure, the 2-2 wiring layer 222 may be electrically connected to the 1-2 connection pad layer P1-2 by the second wiring via 231-2.

Referring to FIG. 16, the first wiring via 231-1 may be disposed in a region of the 2-1 insulating layers 211 overlapping the first board 100 in the lamination direction, the second wiring via 231-2 may be disposed in a region not overlapping first board 100, and the second wiring via 231-2 may be disposed on the external side of the first board 100.

At least a portion of the 2-2 wiring layer 222 may be electrically connected to the 1-2 connection pad layer P1-2 through the second wiring via 231-2 disposed on the external side of the first board 100 described above.

Specifically, the 2-1 via layer 231 of the printed circuit board 700B1 according to another example embodiment in FIG. 16 may include first and second wiring vias 231-1 and 231-2. The first wiring via 231-1 may electrically connect the 2-1 and 2-2 wiring layers 221 and 222 to each other, and the second wiring via 231-2 may electrically connect the 1-2 connection pad layer P1-2 to the 2-2 wiring layer 222. That is, the second wiring via 232-2 may be disposed on an outer side of the second board 200 as compared to the first wiring via 232-1.

Also, the second wiring via 231-2 disposed on the external side of the second board 200 described above may have an average height higher than that of the first wiring via 231-1. That is, the 2-1 via layer 231 may include first and second wiring vias 231-1 and 231-2 having different heights.

By including the structure, a signal may be transmitted via only the 2-2 wiring via 231-2, as compared to a signal transmission path formed by connecting the component disposed on the other surface of the first board 100 via the through-via V and the 2-1 wiring via 231-1 to the second board 200, such that a reduced signal transmission path may be be provided through the 2-2 wiring via 231-2.

The other descriptions are the same as in the aforementioned example embodiment, and will thus not be repeated.

Figure 17:
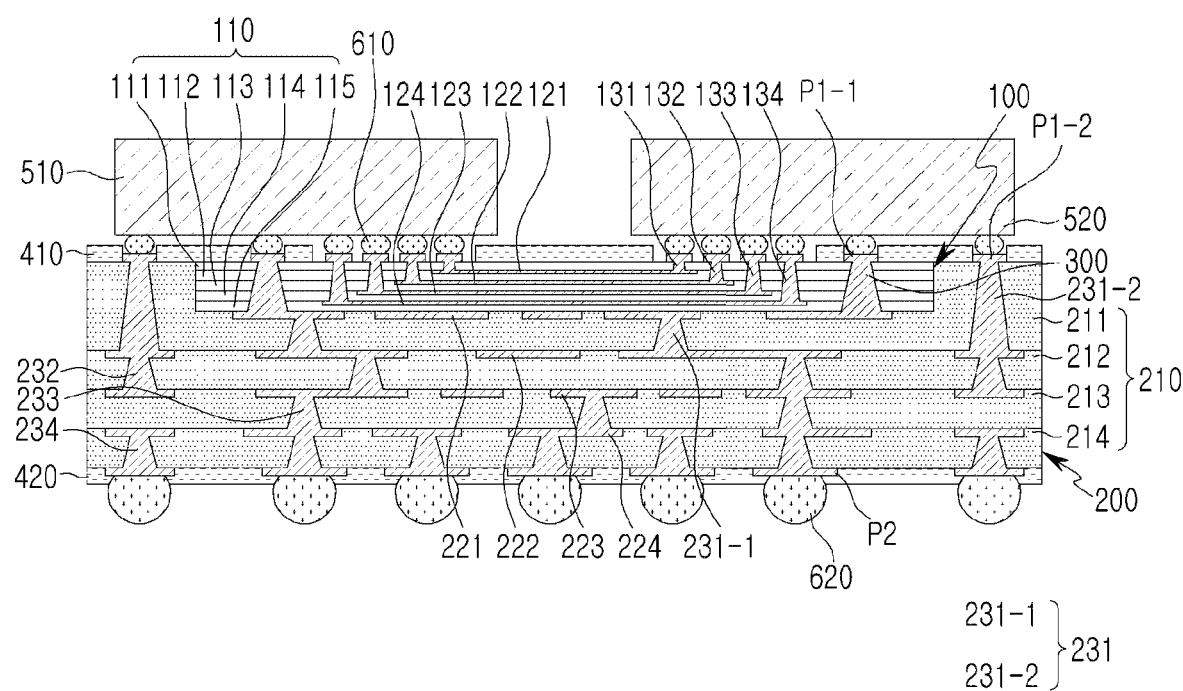
FIG. 17 is a cross-sectional diagram illustrating a modified example of the printed circuit board in FIG. 16.

FIG. 17 is a cross-sectional diagram illustrating a modified example of the printed circuit board in FIG. 16.

Referring to the drawings, in the printed circuit board 700B2 according to the modified example, the plurality of electronic components 510 and 520 may be surface-mounted on the printed circuit board 700B1 in another example embodiment through a first electrical connection metal 610, differently from the printed circuit board 700B1 described in the aforementioned example embodiment. At least a portion of each of the plurality of electronic components 510 and 520 may be electrically connected to each other through the plurality of first wiring layers 121, 122, 123, and 124 in the first board 100. Also, the plurality of electronic components 510 and 520 may be electrically connected to the 2-1 wiring layer 221 of the second board 200 using the through-via 300. Also, the plurality of electronic components 510 and 520 may also be connected to the 2-2 wiring layer 222 of the second board 200 through the second wiring via 231-2 of the 2-1 via layer 231.

With respect to the plurality of electronic components 510 and 520, the description in the above-described modified example in FIG. 4 may be applied thereto. The connection pads of the plurality of electronic components 510 and 520 may include a metal material such as copper (Cu) or aluminum (Al), and may be connected to the first electrical connection metal 610. The first electrical connection metal 610 may be disposed on the 1-1 connection pad layer P1-1 disposed on the other side of the first board 100, and may also be disposed on the 1-2 connection pad layer P1-2 disposed one side of the second board 200. A second electrical connection metal 620 may be disposed on the second connection pad layer P2 disposed on the other side of the second board 200.

In the printed circuit board 700B2 according to the modified example in FIG. 16, the first passivation layer 410 may be partially disposed on one surface of the second board 200. That is, since the first board 100 is configured to be embedded in one surface of the second board 200, the first passivation layer 410 may be formed on the other surface of the embedded first board 100 and also on one surface of the second board 200.

The first electrical connection metal 410 may be disposed on the 1-1 and 1-2 connection pad layers P1-1 and P1-2 exposed externally through the first opening. The second electrical connection metal 420 may be disposed on the other surface of the second board 200 and may be disposed on the second connection pad layer P2 exposed from the second opening of the second passivation layer 620. The first and second electrical connection metals 610 and 620 may include tin (Sn) or an alloy including tin (Sn), such as, for example, solder.

Although not illustrated, a bump including copper (Cu) may be further disposed between the terminals of the electronic components 510 and 520 and the first electrical connection metal 610. Also, an insulating film (not illustrated) including an insulating resin may be disposed between the other surface of the first board 100 and one surface of the second board 200 such that damages to the first electrical connection metal 610 may be prevented and the first electrical connection metal 610 may be insulated from the outside.

The other descriptions are the same as in the aforementioned example embodiment, and will thus not be repeated.

FIGS. 18 to 21 are diagrams illustrating an example of processes of manufacturing the printed circuit board in FIG. 16.

Figure 18:
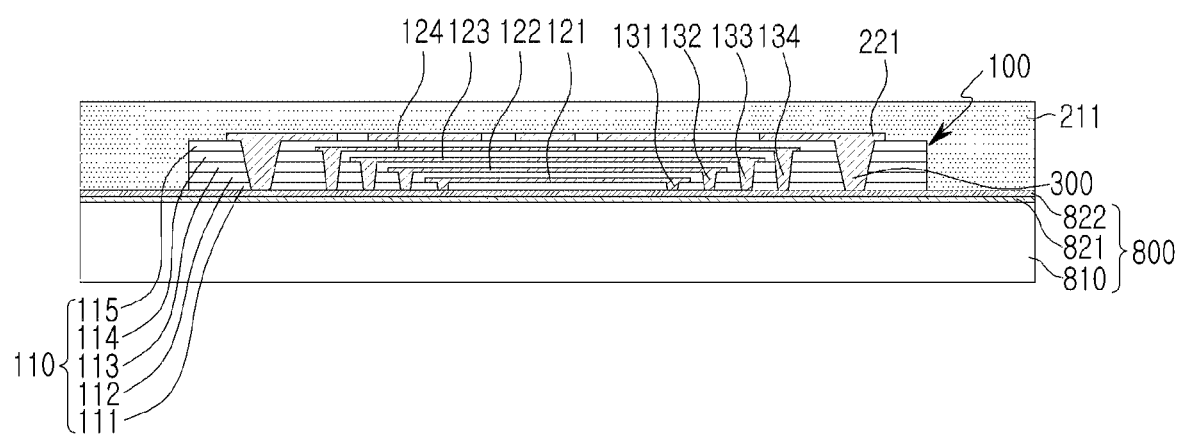
FIGS. 18 to 22 are diagrams illustrating an example of processes of manufacturing the printed circuit board in FIG. 16.

The process diagram in FIG. 18 is of processes after the process in FIG. 10. That is, as for the processes in FIGS. 6 to 10, the processes of manufacturing the printed circuit boards 700A1 and 700B1 according to the aforementioned example embodiment may be the same.

Referring to FIG. 18, in the process of disposing the 2-1 insulating layer 211 after the 2-1 wiring layer 221 is disposed on one surface of the first board 100, the 2-1 may cover the side surface of the first board 100. Accordingly, the first board 100 may be embedded in the 2-1 insulating layer 211. That is, the 2-1 insulating layer 211 may be disposed on the carrier 800 while covering the side surface of the first insulating body 110. In this case, the 2-1 insulating layer 211 covering the side surface of the first insulating body 110 may be coplanar with the other surface of the first board 100.

Figure 19:
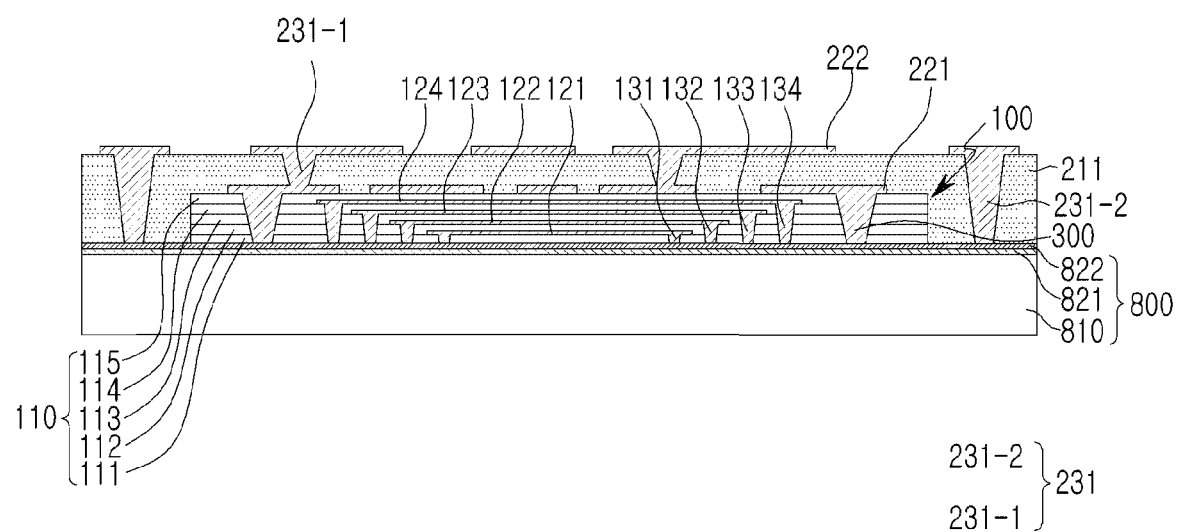

Referring to FIG. 19, the 2-1 via layer 231 penetrating the 2-1 insulating layer 211 may be formed, and the 2-1 via layer 231 may include the first and second wiring vias 231-1 and 231-2. Both the first and second wiring vias 231-1 and 231-2 may be electrically connected to the 2-2 wiring layer 222 disposed on the 2-1 insulating layer 211. The first wiring via 231-1 may electrically connect the 2-2 wiring layer 222 to the 2-1 wiring layer 221, and the second wiring via 231-2 may electrically connect the 2-2 wiring layer 222 to the first connection pad layer P1.

Figure 20:
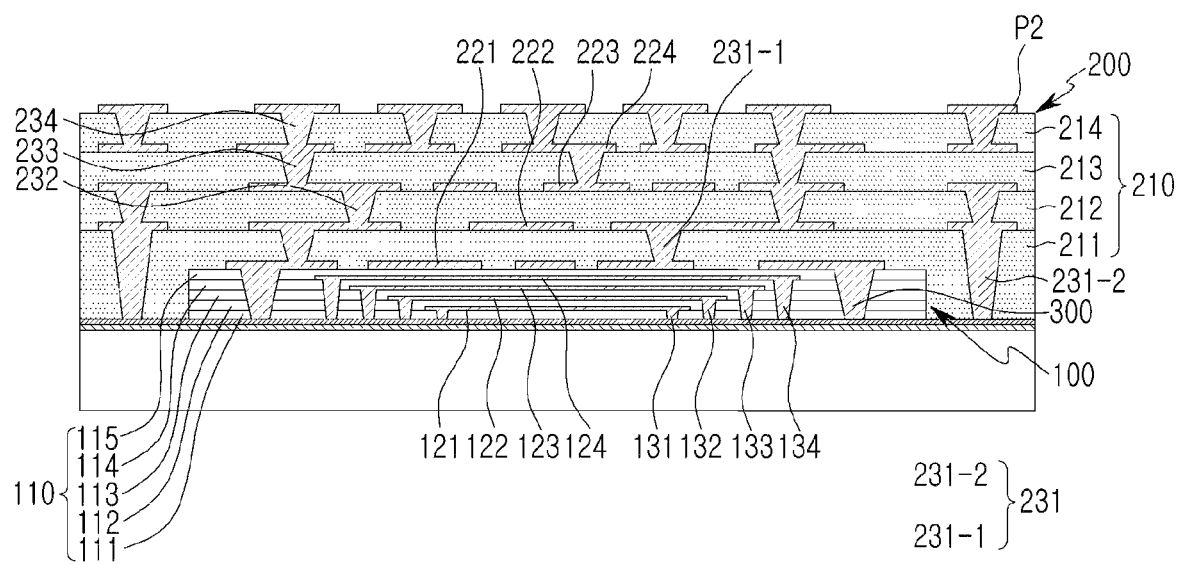

Referring to FIG. 20, the structure of the second board 200 may be manufactured through an additional build-up process.

Figure 21:
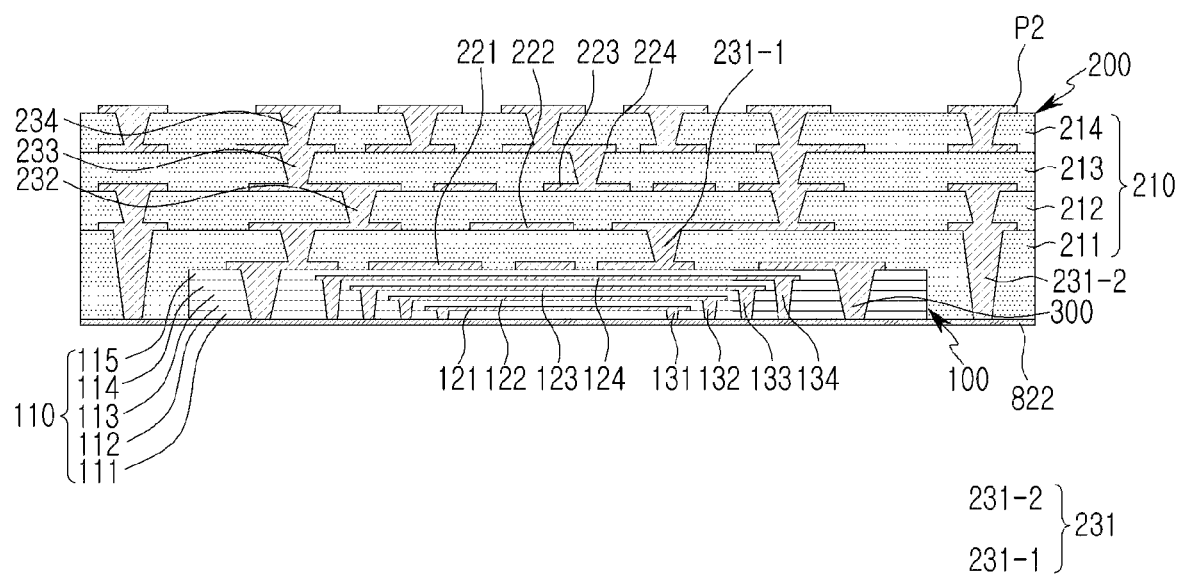
Figure 22:
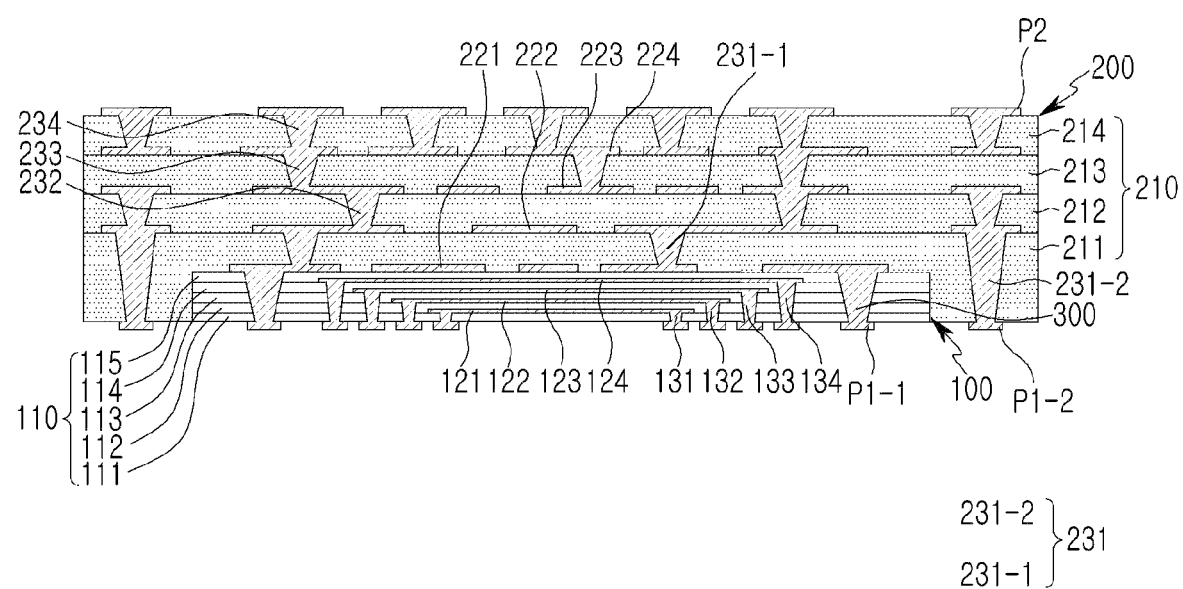

Referring to FIG. 21, a portion of the carrier 800 may be removed by separating the first and second copper foils 821 and 822, the second copper foil 822 may be removed by etching in the process in FIG. 22, and the first connection pad layer P1 covering the exposed plurality of first via layers 131, 132, 133 and 134, the exposed through-via V and the exposed second wiring via 231-2 may be disposed.

Figure 23:
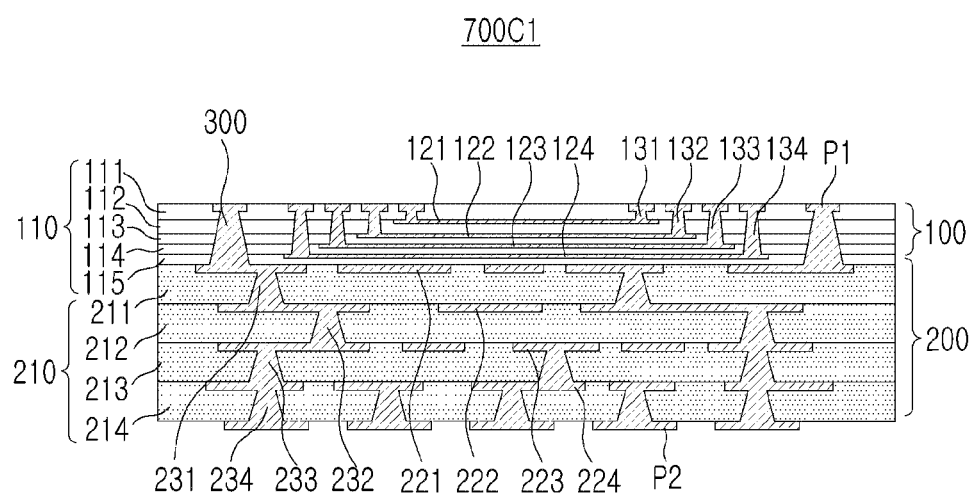
FIG. 23 is a cross-sectional diagram illustrating another example of a printed circuit board.

FIG. 23 is a cross-sectional diagram illustrating another example of a printed circuit board.

Figure 24:
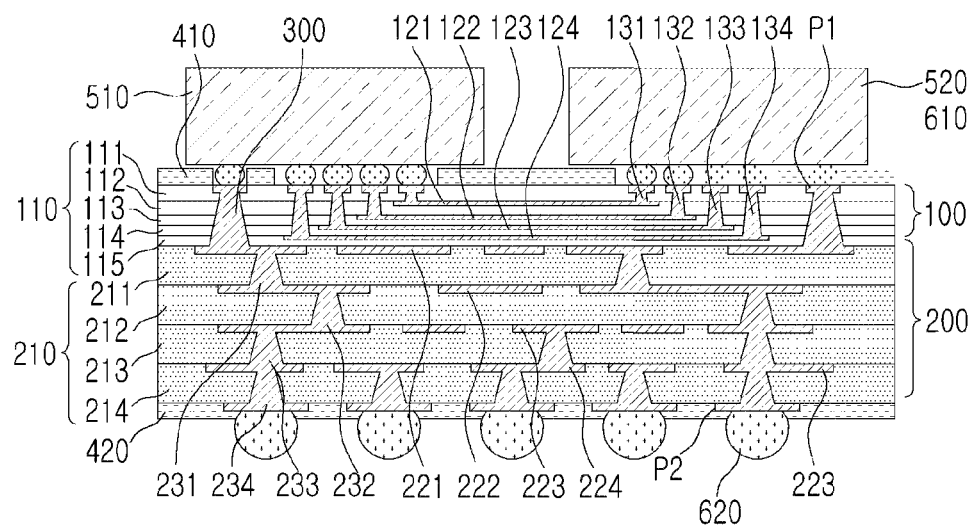
FIG. 24 is a cross-sectional diagram illustrating a modified example of the printed circuit board in FIG. 23.

FIG. 24 is a cross-sectional diagram illustrating a modified example of the printed circuit board in FIG. 23.

In the printed circuit board 700C1 according to another example embodiment in FIG. 23, the position of the first connection pad layer P1 may be different from the position thereof in printed circuit board 700A1 according to the aforementioned example embodiment. Accordingly, in the description of the printed circuit board 700C1 according to another example embodiment below, only the different configuration will be described.

In the printed circuit board 700C1 according to another example embodiment, the first connection pad layer P1 may be embedded in the upper side of the 1-1 insulating layer 111. To bury the first connection pad layer P1 in the 1-1 insulating layer 111, the first connection pad layer P1 may be further disposed on the second copper foil 822 in the process in FIG. 6. Thereafter, the 1-1 insulating layer 111 may be disposed on the second copper foil 822 to cover the first connection pad layer P1.

As the first connection pad layer P1 is disposed on the upper side of the 1-1 insulating layer 111 as described above, the phenomenon in which the first connection pad layer P1 is separated from the 1-1 insulating layer 111 may be prevented in advance. Also, as compared to the structure in which the first connection pad layer P1 protrudes to the 1-1 insulating layer 111, the overall thickness of the printed circuit board 700C1 may be reduced, such that the board may have a reduced thickness.

In the printed circuit board 700C2 according to the modified example in FIG. 24, the first and second passivation layers 410 and 420 having openings, and a plurality of electronic components 510 and 520 may be disposed on the printed circuit board 700C1 according to another example embodiment, and the plurality of electronic components 510 and 520 may be electrically connected to the first connection pad layer P1 embedded in the 1-1 insulating layer 111 by the first electrical connection metal 610.

Meanwhile, a thickness of the 1-1 insulating layer 111 may be same as that of the 1-2 insulating layer 112, or larger than that of the 1-2 insulating layer 112.

The other descriptions are the same as in the aforementioned example embodiment, and will thus not be repeated.

According to the aforementioned example embodiments, a printed circuit board in which a fine circuit is implemented may be provided.

Also, a printed circuit board in which a connection structure is not embedded and a fine circuit is disposed on a redistribution layer may be provided.

Further, a printed circuit board having high surface flatness to easily mount electronic components thereon may be provided.

Also, a printed circuit board having an improved yield by initially manufacturing a board on which a fine circuit is implemented may be provided.

In the example embodiments, the terms "side portion," "side surface," and the like, may be used to refer to a surface formed taken in right/left directions with reference to a cross-section in the diagrams for ease of description, the terms "upper side," "upper portion," "upper surfaces," and the like, may be used to refer to a surface formed in an upward direction with reference to a cross-section in the diagrams for ease of description, and the terms "lower side," "lower portion," "lower surface," and the like, may be used to refer to a surface formed in a downward direction. The notion that an element is disposed on a side region, an upper side, an upper region, or a lower resin may include the configuration in which the element is directly in contact with an element configured as a reference in respective directions, and the configuration in which the element is not directly in contact with the reference element. The terms, however, may be defined as above for ease of description, and the scope of right of the example embodiments is not particularly limited to the above terms.

In the example embodiments, the term "connected" may not only refer to "directly connected" but also include "indirectly connected" by may refer to of an adhesive layer, or the like. Also, the term "electrically connected" may include both of the case in which elements are "physically connected" and the case in which elements are "not physically connected." Further, the terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the example embodiments.

In the example embodiments, the term "example embodiment" may not refer to one same example embodiment, and may be provided to describe and emphasize different unique features of each example embodiment. The above suggested example embodiments may be implemented do not exclude the possibilities of combination with features of other example embodiments. For example, even though the features described in an example embodiment are not described in the other example embodiment, the description may be understood as relevant to the other example embodiment unless otherwise indicated.

An expression used in the singular encompasses the expression of the plural, unless it has a clearly different meaning in the context.

While the example embodiments have been illustrated and described above, it will be apparent to those skilled in the art that modifications and variations could be made without departing from the scope of the present invention as defined by the appended claims.

What is claimed is:

1. A printed circuit board, comprising:
a first board including a plurality of first insulating layers and a plurality of first wiring layers disposed between the plurality of first insulating layers, respectively; and
a second board disposed on one surface of the first board and including a plurality of second insulating layers and a plurality of second wiring layers disposed on or between the plurality of second insulating layers, respectively, wherein at least one of the plurality of first insulating layers has a thickness less than a thickness of at least one of the plurality of second insulating layers,
wherein the first board further includes a through-via penetrating each of the plurality of first insulating layers and connected to one of the plurality of second wiring layers,
wherein the through-via is spaced apart from wiring layers embedded inside in the first board among the plurality of first wiring layers, wherein the through-via extends from the one surface to the other surface of the first board and has a tapered shape in which a cross-sectional area thereof decreases from the one surface to the other surface of the first board, and wherein a portion of the other surface of the first board is an external portion of the printed circuit board.

2. The printed circuit board of claim 1, wherein, among the plurality of second wiring layers, a wiring layer in contact with and connected to the through-via is disposed on the one surface of the first board.

3. The printed circuit board of claim 1, wherein an average pitch of at least one of the plurality of first wiring layers is smaller than and an average pitch of at least one of the plurality of second wiring layers.

4. The printed circuit board of claim 1, wherein an average distance between the plurality of first wiring layers is smaller than an average distance between the plurality of second wiring layers.

5. The printed circuit board of claim 1, wherein the first board includes a plurality of first via layers penetrating at least one of the plurality of first insulating layers and connected to one of the plurality of first wiring layers.

6. The printed circuit board of claim 5, wherein the plurality of first via layers and the through-via extend from the other surface of the first board.

7. The printed circuit board of claim 6,
wherein the plurality of first via layers have a tapered shape in which a cross-sectional area thereof decreases toward the other surface of the first board, and
wherein the through-via has a height greater than a height of each of the plurality of first via layers in a lamination direction of the plurality of first insulating layers.

8. The printed circuit board of claim 5, wherein, among the plurality of first via layers, a via layer connected to one wiring layer of the plurality of first wiring layers has a height smaller than a height of another via layer connected to another wiring layer of the plurality of first wiring layers, the one wiring layer being closer to the other surface of the first board than the another wiring layer.

9. The printed circuit board of claim 5, further comprising:
a first connection pad layer protruding from the other surface of the first board,
wherein the first connection pad layer is connected to at least one of the plurality of first via layers and the through-via extending from the other surface of the first board.

10. The printed circuit board of claim 5, further comprising:
a first connection pad layer embedded from the other surface of the first board,
wherein the first connection pad layer is covered by one of the plurality of first insulating layers, and
wherein the first connection pad layer is connected to at least one of the plurality of first via layers and the through-via.

11. The printed circuit board of claim 10, further comprising:
an electronic component mounted on the other surface of the first board; and
a first electrical connection metal disposed on the other surface of the first board and connecting the first connection pad layer to the electronic component.

12. The printed circuit board of claim 1,
wherein the second board includes a plurality of second via layers penetrating at least one of the plurality of second insulating layers and connected to one of the plurality of second wiring layers, and
wherein the plurality of second via layers have a tapered shape in which a cross-sectional area thereof decreases toward the one surface of the first board.

13. The printed circuit board of claim 1, wherein at least a portion of the plurality of second insulating layers includes a material having stiffness relatively greater than stiffness of the plurality of first insulating layers.

14. The printed circuit board of claim 1,
wherein, among the plurality of second wiring layers, a wiring layer in contact with and connected to the through-via is embedded from one surface of the second board, and
wherein, among the plurality of second insulating layers, a layer providing the other surface of the second board includes the same material as a material of the plurality of first insulating layers.

15. A printed circuit board, comprising: a first board including a plurality of first insulating layers, a plurality of first wiring layers, and a plurality of first via layers; and a second board covering the first board and including a plurality of second insulating layers, a plurality of second wiring layers, and a plurality of second via layers, wherein the first board further includes a through-via penetrating each of the plurality of first insulating layers and connected to one of the plurality of second wiring layers, wherein the plurality of second insulating layers include one insulating layer covering one surface and a side surface of the first board, wherein the through-via is spaced apart from wiring layers embedded inside in the first board among the plurality of first wiring layers, wherein the through-via extends from the one surface to the other surface of the first board and has a tapered shape in which a cross-sectional area thereof decreases from the one surface to the other surface of the first board, and wherein a portion of the other surface of the first board is an external portion of the printed circuit board.

16. The printed circuit board of claim 15,
wherein one of the plurality of second via layers includes a one via layer penetrating the one insulating layer, and
wherein the one via layer includes a plurality of wiring vias having different heights.

17. The printed circuit board of claim 16, wherein the plurality of first via layers extend from the other surface of the first board, and wherein at least a portion of the one via layer extends from one surface of the one insulating layer.

18. A printed circuit board, comprising:
a first board including a plurality of first insulating layers and a plurality of first wiring layers disposed between the plurality of first insulating layers, respectively; and
a second board disposed directly on the first board and including a plurality of second insulating layers and a plurality of second wiring layers disposed on or between the plurality of second insulating layers, respectively, wherein at least one of the plurality of first insulating layers has a thickness less than a thickness of at least one of the plurality of second insulating layers, wherein vias connected to the plurality of first wiring layers and the plurality of second wiring layers have a tapered shape in which a cross-sectional area thereof decreases from the second board to the first board, wherein a portion of one of the plurality of first insulating layers is an external portion of the printed circuit board, wherein the first board further includes a through-via penetrating each of the plurality of first insulating layers and connected to one of the plurality of second wiring layers,
wherein the through-via extends from one surface to the other surface of the first board and has a tapered shape in which a cross-sectional area thereof decreases from the one surface to the other surface of the first board, and wherein a portion of the other surface of the first board is an external portion of the printed circuit board.

19. The printed circuit board of claim 18, wherein the vias disposed in the first board extend from a surface of an exterior one of the plurality of first insulating layers.

20. The printed circuit board of claim 18, wherein the vias disposed in the first board extend from one of the plurality of first wiring layers which is embedded in an exterior one of the plurality of first insulating layers.

21. The printed circuit board of claim 18, wherein the first body and the second body have a same width.

22. The printed circuit board of claim 18, wherein a thickness of each of the plurality of first insulating layers is less than a thickness of each of the plurality of second insulating layers.

23. The printed circuit board of claim 18, wherein, among the plurality of first via layers, a via layer connected to one wiring layer of the plurality of first wiring layers has a height smaller than a height of another via layer connected to another wiring layer of the plurality of first wiring layers, the another wiring layer being closer to the second board than the one wiring layer.

* * * * *